US010269301B2

(12) United States Patent
Kishi et al.

(10) Patent No.: US 10,269,301 B2
(45) Date of Patent: Apr. 23, 2019

(54) DISPLAY DEVICE AND DRIVE METHOD THEREFOR

(71) Applicant: Sharp Kabushiki Kaisha, Sakai, Osaka (JP)

(72) Inventors: Noritaka Kishi, Sakai (JP); Hiroyuki Furukawa, Sakai (JP); Katsuya Otoi, Sakai (JP); Kazuyoshi Yoshiyama, Sakai (JP); Tamotsu Sakai, Sakai (JP); Naoko Gotoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/559,883

(22) PCT Filed: Mar. 18, 2016

(86) PCT No.: PCT/JP2016/058642
§ 371 (c)(1),
(2) Date: Sep. 20, 2017

(87) PCT Pub. No.: WO2016/158481
PCT Pub. Date: Oct. 6, 2016

(65) Prior Publication Data
US 2018/0061328 A1 Mar. 1, 2018

(30) Foreign Application Priority Data

Mar. 27, 2015 (JP) .................. 2015-065962

(51) Int. Cl.
*G09G 3/30* (2006.01)
*G09G 5/10* (2006.01)
(Continued)

(52) U.S. Cl.
CPC ..... *G09G 3/3291* (2013.01); *G01R 19/16576* (2013.01); *G09G 3/3225* (2013.01);
(Continued)

(58) Field of Classification Search
CPC ......... G09G 2320/0233; G09G 3/3233; G09G 2320/0693
See application file for complete search history.

(56) References Cited

U.S. PATENT DOCUMENTS

2004/0051684 A1* 3/2004 Ishizuka .............. G09G 3/3233
345/76
2009/0244047 A1 10/2009 Mizutani et al.
(Continued)

FOREIGN PATENT DOCUMENTS

JP 06-313840 A 11/1994
JP 2009-244654 A 10/2009
(Continued)

OTHER PUBLICATIONS

Official Communication issued in International Patent Application No. PCT/JP2016/058642, dated Jun. 14, 2016.

*Primary Examiner* — Nan-Ying Yang
(74) *Attorney, Agent, or Firm* — Keating & Bennett, LLP

(57) ABSTRACT

In a current measurement period of a pixel circuit (20), a measurement voltage is applied to a non-inverting input terminal of an operational amplifier (31), switches (35, 36) turn on, and a switch (37) turns off. Next, the switch (36) turns off, and a capacitor (32) is charged with charge of a current flowing through the pixel circuit (20). Next, the switch (35) turns off, the switch (37) turns on, a constant current flows through a current source (33), and a voltage of a second terminal (terminal connected to an output terminal of the operational amplifier (31)) of the capacitor (32) decreases. A voltage comparator (42) and a counter (43) measure the current flowing through the pixel circuit (20) by measuring time until a voltage of the second terminal of the capacitor reaches a voltage Vcomp. A video signal VS1 is corrected based on a current measurement result. With this, (Continued)

it is possible to compensate for capacitance variation of a capacitance in a current measurement circuit and perform high image quality display.

14 Claims, 12 Drawing Sheets

(51) Int. Cl.
  *G09G 3/3291* (2016.01)
  *G09G 3/3233* (2016.01)
  *G01R 19/165* (2006.01)
  *G09G 3/3266* (2016.01)
  *G09G 3/3225* (2016.01)
  *G09G 3/3275* (2016.01)
(52) U.S. Cl.
  CPC ......... *G09G 3/3233* (2013.01); *G09G 3/3266* (2013.01); *G09G 3/3275* (2013.01); *G09G 2310/0289* (2013.01); *G09G 2310/0291* (2013.01); *G09G 2310/08* (2013.01); *G09G 2320/0233* (2013.01)

(56) References Cited

U.S. PATENT DOCUMENTS

| | | |
|---|---|---|
| 2010/0103159 A1 | 4/2010 | Leon |
| 2011/0074762 A1 | 3/2011 | Shirasaki et al. |
| 2011/0254871 A1* | 10/2011 | Yoo ................... G09G 3/3233 345/690 |
| 2011/0273101 A1* | 11/2011 | Liu ..................... G09G 3/3406 315/192 |
| 2016/0111044 A1 | 4/2016 | Kishi et al. |
| 2016/0125796 A1 | 5/2016 | Ohara et al. |

FOREIGN PATENT DOCUMENTS

| | | |
|---|---|---|
| JP | 2011-095720 A | 5/2011 |
| JP | 2012-507746 A | 3/2012 |
| WO | 2014/208459 A1 | 12/2014 |
| WO | 2015/037331 A1 | 3/2015 |

* cited by examiner

DISPLAY DEVICE AND DRIVE METHOD THEREFOR

TECHNICAL FIELD

The present invention relates to a display device, especially to a display device having a pixel circuit including an electro-optical element such as an organic EL element, and a drive method therefor.

BACKGROUND ART

In recent years, an organic EL (Electro Luminescence) display device has been attracting attention as a thin, light-weight, fast-response display device. The organic EL display device includes a plurality of pixel circuits arranged two-dimensionally. The pixel circuit of the organic EL display device includes an organic EL element, and a drive transistor connected in series with the organic EL element. The drive transistor controls an amount of current flowing through the organic EL element, and the organic EL element emits light at brightness in accordance with the amount of the flowing current.

In a manufacturing process, variation occurs in characteristics of elements in the pixel circuit. Furthermore, the characteristics of the elements in the pixel circuit fluctuate with a passage of time. For example, characteristics of the drive transistor individually degrade in accordance with light emission brightness and light emission time. The same holds true for characteristics of the organic EL element. Thus, even when a same voltage is applied to gate terminals of the drive transistors, variation occurs in the light emission brightness of the organic EL elements.

Thus, in order to perform high image quality display in the organic EL display device, there is known a method in which a video signal is corrected so that variation and fluctuation of the characteristics of the organic EL element and the drive transistor are compensated. For example, Patent Document 1 discloses an organic EL display device for compensating for the fluctuation of the characteristics of the organic EL element by measuring a voltage between terminals of the organic EL element when a detection current flows through the organic EL element, and correcting a video signal based on the measured voltage.

PRIOR ART DOCUMENT

Patent Document

[Patent Document 1] Japanese Laid-Open Patent Publication No. 2009-244654

SUMMARY OF THE INVENTION

Problems to be Solved by the Invention

However, the variation of the characteristics of the elements also occurs at portions other than the pixel circuit. In the following, in order to compensate for the variation and the fluctuation of the characteristics of the elements in the pixel circuit, an organic EL display device including a current measurement circuit for measuring a current flowing through the pixel circuit will be considered. When the current measurement circuit including an operational amplifier and a capacitor is used, variation occurs in the capacitance of the capacitor due to variation in semiconductor process for forming the current measurement circuit. Furthermore, an organic EL display device including a plurality of current measurement circuits is provided with a plurality of semiconductor chips including one or more current measurement circuits. In this case, capacitance variation between the capacitors included in different semiconductor chips is larger than the capacitance variation between the capacitors included in a same semiconductor chip.

When capacitance variation occurs between the capacitors in the current measurement circuit, the current flowing through the pixel circuit can not be measured accurately, and the video signal can not be corrected accurately so that the variation and the fluctuation of the characteristics of the elements in the pixel circuit are compensated. Thus, in the organic EL display device, even if the video signal is corrected based on a current measurement result, high image quality display may not be performed being affected by the capacitance variation of the capacitor in the current measurement circuit.

Accordingly, an object of the present invention is to provide a display device which performs high image quality display by compensating for the capacitance variation of the capacitor in the current measurement circuit.

Means for Solving the Problems

According to a first aspect of the present invention, there is provided an active-matrix type display device having: a display unit including a plurality of scanning lines, a plurality of data lines, and a plurality of pixel circuits arranged two-dimensionally; a scanning line drive circuit configured to drive the scanning lines; a data line drive circuit configured to drive the data lines; a current measurement circuit configured to measure a current flowing through the pixel circuit; and a correction unit configured to correct a video signal to be supplied to the data line drive circuit, based on the current measured by the current measurement circuit, wherein the current measurement circuit includes: a capacitor configured to be charged with charge of the current flowing through the pixel circuit; and a discharge circuit configured to discharge the charge accumulated in the capacitor at a constant speed.

According to a second aspect of the present invention, in the first aspect of the present invention, the discharge circuit is provided so as to be electrically connectable to a first terminal of the capacitor, and the current measurement circuit is configured to measure the current flowing through the pixel circuit by measuring time until a voltage of a second terminal of the capacitor reaches a comparison target voltage.

According to a third aspect of the present invention, in the second aspect of the present invention, the current measurement circuit further includes: an operational amplifier having an inverting input terminal connected to the first terminal of the capacitor and an output terminal connected to the second terminal of the capacitor; a first switch provided between the first terminal and the second terminal of the capacitor; a second switch having one end connected to the first terminal of the capacitor; a voltage comparator configured to compare the voltage of the second terminal of the capacitor with the comparison target voltage; and a counter configured to switch whether to update a count value in accordance with a comparison result by the voltage comparator, and the discharge circuit is a current source connected to the other end of the second switch.

According to a fourth aspect of the present invention, in the third aspect of the present invention, the current measurement circuit further includes a third switch having one end connected to the data line and the other end connected to the first terminal of the capacitor.

According to a fifth aspect of the present invention, in the third aspect of the present invention, the current measurement circuit further includes a selector configured to select one voltage from among voltages of second terminals of a plurality of the capacitors and output a selected voltage to the voltage comparator.

According to a sixth aspect of the present invention, in the third aspect of the present invention, the current source is provided corresponding to a plurality of the capacitors.

According to a seventh aspect of the present invention, in the third aspect of the present invention, a current flowing through the current source is larger than a maximum current flowing through the pixel circuit.

According to an eighth aspect of the present invention, in the first aspect of the present invention, the pixel circuit includes an electro-optical element, and a drive transistor connected in series with the electro-optical element.

According to a ninth aspect of the present invention, in the eighth aspect of the present invention, the display device further includes a storing unit configured to store a plurality of measurement voltages with respect to the electro-optical element and the drive transistor for each pixel circuit, wherein the correction unit is configured to correct the video signal based on the measurement voltage stored in the storing unit.

According to a tenth aspect of the present invention, in the ninth aspect of the present invention, the correction unit is configured to update the measurement voltage stored in the storing unit, in accordance with a result obtained by comparing the current measured by the current measurement circuit with a reference current.

According to an eleventh aspect of the present invention, in the eighth aspect of the present invention, the display device further includes a storing unit configured to store a plurality of current data in accordance with a reference current with respect to the electro-optical element and the drive transistor for each pixel circuit, wherein the correction unit is configured to correct the video signal based on the current data stored in the storing unit.

According to a twelfth aspect of the present invention, in the eleventh aspect of the present invention, the correction unit is configured to update the current data stored in the storing unit, in accordance with a result obtained by comparing the current measured by the current measurement circuit with the reference current.

According to a thirteenth aspect of the present invention, in the fourth aspect of the present invention, a current measurement period of the pixel circuit sequentially includes a first period in which a measurement voltage is applied to a non-inverting input terminal of the operational amplifier, the first and third switches are in a conduction state, and the second switch is in a non-conduction state, a second period in which the first switch is in the non-conduction state, and a third period in which the second switch is in the conduction state and the third switch is in the non-conduction state.

According to a fourteenth aspect of the present invention, in the thirteenth aspect of the present invention, the current measurement period of the pixel circuit further includes, after the third period, a period in which a data voltage based on the video signal is applied to the non-inverting input terminal of the operational amplifier, the first and third switches are in the conduction state, and the second switch is in the non-conduction state.

According to a fifteenth aspect of the present invention, in the fourteenth aspect of the present invention, the current measurement period of the pixel circuit further includes, before the first period, a period in which a precharge voltage is applied to the non-inverting input terminal of the operational amplifier, the first and third switches are in the conduction state, and the second switch is in the non-conduction state.

According to a sixteenth aspect of the present invention, in the eighth aspect of the present invention, the pixel circuit further includes: a write control transistor having a first conduction terminal connected to the data line, a second conduction terminal connected to a control terminal of the drive transistor, and a control terminal connected to a first scanning line in the scanning lines; and a read control transistor having a first conduction terminal connected to the data line, a second conduction terminal connected to a connection point of the drive transistor and the electro-optical element, and a control terminal connected to a second scanning line in the scanning lines.

According to a seventeenth aspect of the present invention, there is provided a drive method for an active-matrix type display device having a display unit including a plurality of scanning lines, a plurality of data lines, and a plurality of pixel circuits arranged two-dimensionally, the method including the steps of: driving the scanning lines; driving the data lines; measuring a current flowing through the pixel circuit; and correcting a video signal used for driving the data lines based on the measured current, wherein the measuring includes: charging a capacitor with charge of the current flowing through the pixel circuit; and discharging the charge accumulated in the capacitor at a constant speed.

Effects of the Invention

According to the first or seventeenth aspect of the present invention, the capacitor is charged with the charge of the current flowing through the pixel circuit, and then the charge accumulated in the capacitor is discharged at a constant speed. An amount of the charge accumulated in the capacitor and a change speed of a terminal voltage of the capacitor when discharging do not depend on a capacitance of the capacitor. Thus, it is possible to accurately measure the current flowing through the pixel circuit based on the terminal voltage of the capacitor without being affected by the capacitance of the capacitor. Therefore, it is possible to compensate for capacitance variation of the capacitor in the current measurement circuit and perform high image quality display by correcting the video signal based on a current measurement result.

According to the second aspect of the present invention, the current flowing through the pixel circuit can be measured by electrically connecting the first terminal of the capacitor to the discharge circuit and measuring time until the voltage of the second terminal of the capacitor reaches the comparison target voltage.

According to the third aspect of the present invention, by actions of the first and second switches, the capacitor is charged with the charge of the current flowing through the pixel circuit, and then the charge accumulated in the capacitor is discharged at a constant speed. Furthermore, the time until the voltage of the second terminal of the capacitor reaches the comparison target voltage can be obtained using the voltage comparator and the counter. Therefore, it is possible to accurately measure the current flowing through the pixel circuit based on the voltage of the second terminal of the capacitor without being affected by the capacitance of the capacitor.

According to the fourth aspect of the present invention, when the third switch is controlled to be in the non-conduction state, the current measurement circuit is electrically disconnected from the data line. The current flowing through the pixel circuit can be measured by discharging the charge accumulated in the capacitor in this state.

According to the fifth aspect of the present invention, a number of the voltage comparators and the counters in the current measurement circuit can be reduced by providing the selector.

According to the sixth aspect of the present invention, a number of the current sources can be reduced by providing the current source corresponding to the plurality of the capacitors.

According to the seventh aspect of the present invention, it is possible to sufficiently discharge the charge accumulated in the capacitor in the discharge period and correctly measure the current flowing through the pixel circuit, by setting the current flowing through the current source larger than the maximum current flowing through the pixel circuit.

According to the eighth aspect of the present invention, it is possible to compensate for the capacitance variation of the capacitor in the current measurement circuit and perform high image quality display in the display device having the pixel circuit including the electro-optical element and the drive transistor.

According to the ninth aspect of the present invention, it is possible to obtain the characteristics of the electro-optical element and the drive transistor for each pixel circuit based on the stored measurement voltage and correct the video signal using the obtained characteristics.

According to the tenth aspect of the present invention, the measurement voltage can be obtained easily by updating the stored measurement voltage in accordance with the result obtained by comparing the measured current and the reference current.

According to the eleventh aspect of the present invention, it is possible to obtain the characteristics of the electro-optical element and the drive transistor for each pixel circuit based on the stored current data and correct the video signal using the obtained characteristics.

According to the twelfth aspect of the present invention, the current data can be obtained easily by updating the stored current data in accordance with the result obtained by comparing the measured current and the reference current.

According to the thirteenth aspect of the present invention, by sequentially controlling states of the first to third switches, it is possible to charge the capacitor with the charge of the current flowing through the pixel circuit, and discharge the charge accumulated in the capacitor at a constant speed. Therefore, the current flowing through the pixel circuit can be measured accurately without being affected by the capacitance of the capacitor.

According to the fourteenth aspect of the present invention, it is possible to write the data voltage to the pixel circuit and display an image based on the video signal immediately after measuring the current, by applying the data voltage to the data line after measuring the current.

According to the fifteenth aspect of the present invention, elements in the pixel circuit can be initialized before measuring the current by applying the precharge voltage to the data line before measuring the current.

According to the sixteenth aspect of the present invention, it is possible to compensate for the capacitance variation of the capacitor in the current measurement circuit and perform high image quality display, in the display device having the pixel circuit including the electro-optical element, the drive transistor, the write control transistor, and the read control transistor.

MODES FOR CARRYING OUT THE INVENTION

Figure 1:
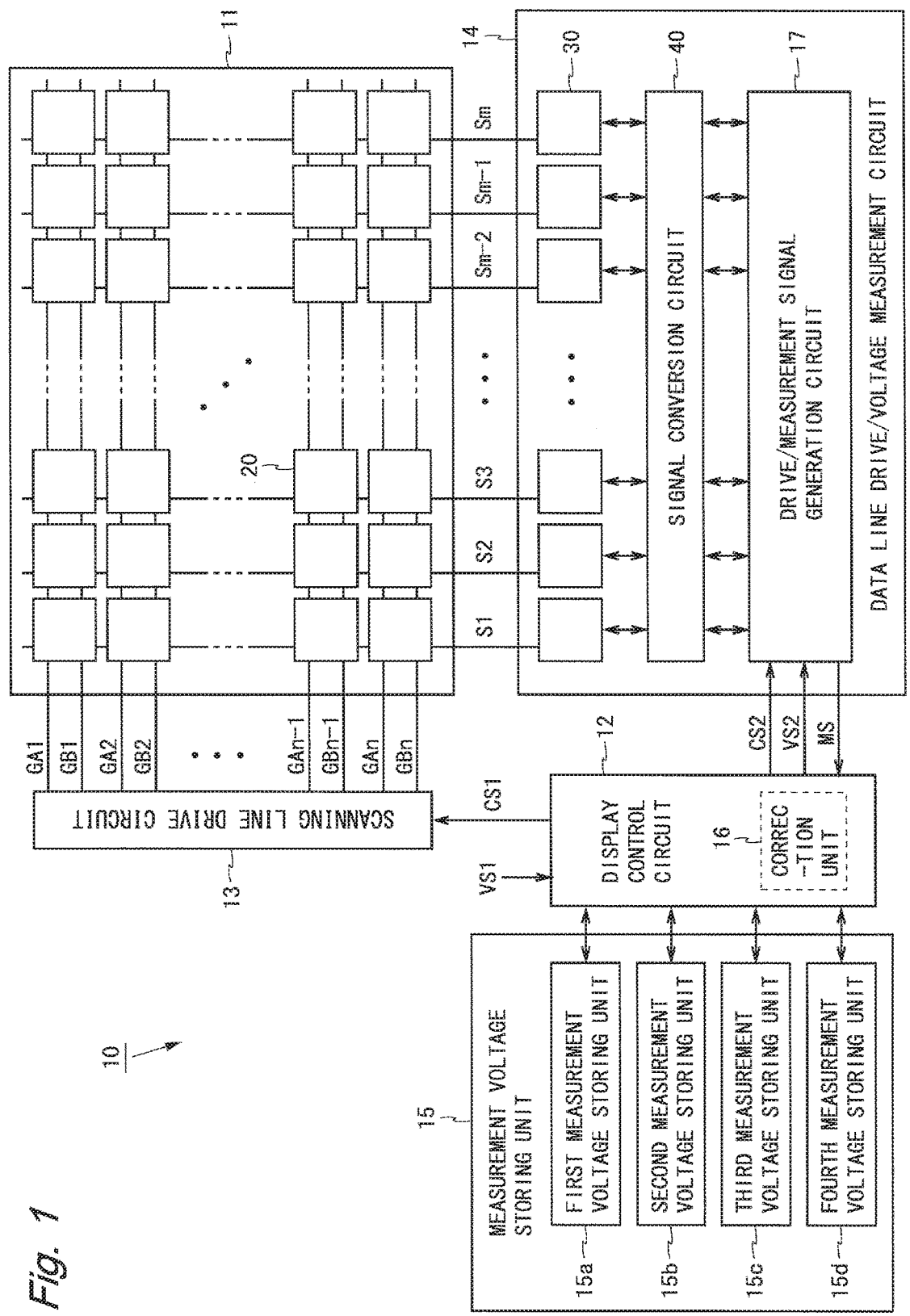
FIG. 1 is a block diagram showing a configuration of a display device according to a first embodiment of the present invention.

In the following, display devices according to embodiments of the present invention will be described referring to the drawings. The display device according to the embodiment of the present invention is an active-matrix type organic EL display device having a pixel circuit including an organic EL element and a drive transistor. In the following description, a thin film transistor may be referred to as TFT (Thin Film Transistor), and an organic EL element may be referred to as OLED (Organic Light Emitting Diode). Furthermore, it is assumed that m, n, and p are integers not less than 2, i is an integer not less than 1 and not more than n, and j is an integer not less than 1 and not more than m.

(First Embodiment)

FIG. 1 is a block diagram showing a configuration of a display device according to a first embodiment of the present invention. A display device 10 shown in FIG. 1 includes a display unit 11, a display control circuit 12, a scanning line drive circuit 13, a data line drive/current measurement circuit 14 (a combined circuit of a data line drive circuit and a current measurement circuit), and a measurement voltage storing unit 15. The display control circuit 12 includes a correction unit 16. The display unit 11 includes 2n scanning lines GA1 to GAn, GB1 to GBn, m data lines S1 to Sm, and (m×n) pixel circuits 20. The scanning lines GA1 to GAn, GB1 to GBn are arranged in parallel to each other. The data lines S1 to Sm are arranged in parallel to each other so as to intersect with the scanning lines GA1 to GAn, GB1 to GBn perpendicularly. The scanning lines GA1 to GAn and the data lines S1 to Sm intersect at (m×n) points. The (m×n) pixel circuits 20 are arranged two-dimensionally corresponding to intersections of the scanning lines GA1 to GAn and the data lines S1 to Sm. A high-level power supply voltage ELVDD and a low-level power supply voltage ELVSS are supplied to the pixel circuit 20 using a power supply line or a power supply electrode not shown.

A video signal VS1 is input to the display device 10 from the outside. Based on the video signal VS1, the display control circuit 12 outputs a control signal CS1 to the scanning line drive circuit 13, and outputs a control signal CS2 and a video signal VS2 to the data line drive/current measurement circuit 14. The control signal CS1 includes a gate start pulse and a gate clock, for example. The control signal CS2 includes a source start pulse and a source clock, for example. The video signal VS2 is obtained by correcting the video signal VS1 in the correction unit 16 in a manner described later.

The scanning line drive circuit 13 and the data line drive/current measurement circuit 14 are provided at the outside of the display unit 11. The scanning line drive circuit 13 and the data line drive/current measurement circuit 14 selectively perform a processing for writing a data voltage in accordance with the video signal VS2 to the pixel circuit 20, and a processing for measuring a current flowing through the pixel circuit 20 when a measurement voltage is written to the pixel circuit 20. Hereinafter, the former is referred to as "writing", and the latter is referred to as "measuring current".

The scanning line drive circuit 13 drives the scanning lines GA1 to GAn, GB1 to GBn based on the control signal CS1. When writing, the scanning line drive circuit 13 sequentially selects one scanning line from among the scanning lines GA1 to GAn, and applies a selection voltage (here, a high-level voltage) to the selected scanning line. With this, m pieces of the pixel circuits 20 connected to the selected scanning line are selected collectively.

The data line drive/current measurement circuit 14 includes a drive/measurement signal generation circuit 17 (a generation circuit of a drive signal and a measurement signal), a signal conversion circuit 40, and m output/measurement circuits 30 (a combined circuit of an output circuit and a measurement circuit), and drives the data lines S1 to Sm based on the control signal CS2. When writing, the data line drive/current measurement circuit 14 applies m data voltages in accordance with the video signal VS2 to the data lines S1 to Sm, respectively. With this, the m data voltages are written to the m selected pixel circuits 20, respectively.

Operations of the scanning line drive circuit 13 and the data line drive/current measurement circuit 14 when measuring current will be described later. The data line drive/current measurement circuit 14 outputs, to the display control circuit 12, a monitor signal MS indicating a result obtained by measuring the current flowing through the pixel circuit 20.

The correction unit 16 obtains the video signal VS2 by obtaining characteristics of a drive transistor and an organic EL element in the pixel circuit 20 based on the monitor signal MS and correcting the video signal VS1 using the obtained characteristics. The measurement voltage storing unit 15 is a working memory of the correction unit 16. The measurement voltage storing unit 15 includes first to fourth measurement voltage storing units 15a to 15d. The first to fourth measurement voltage storing units 15a to 15d respectively store first to fourth measurement voltages Vm1 to Vm4 with respect to each pixel circuit 20.

Figure 2:
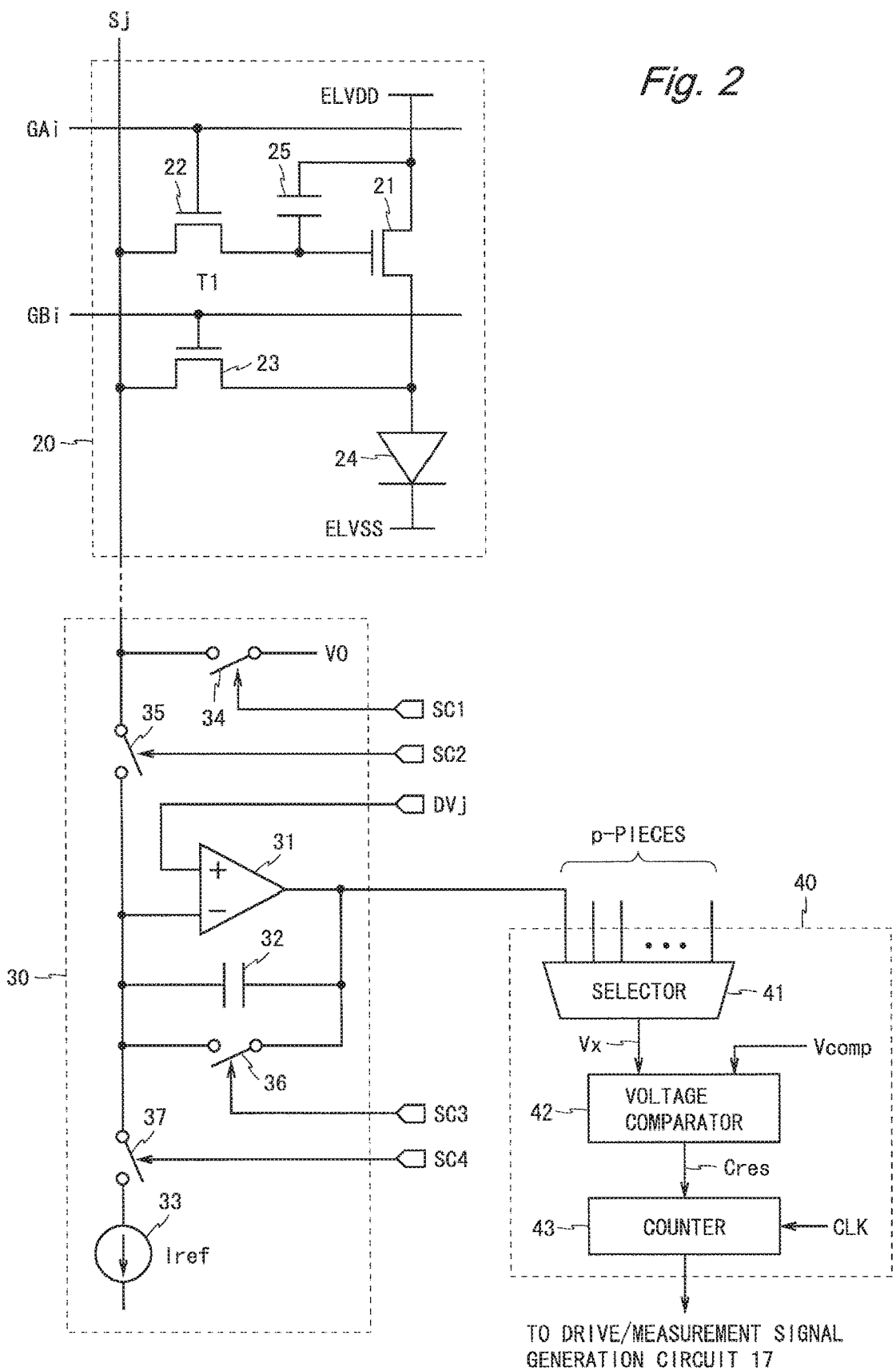
FIG. 2 is a diagram showing a pixel circuit and a current measurement circuit of the display device shown in FIG. 1.

FIG. 2 is a diagram showing the pixel circuit 20 and a current measurement circuit in the data line drive/current measurement circuit 14. FIG. 2 depicts a pixel circuit 20 in an i-th row and a j-th column, an output/measurement circuit 30 corresponding to a data line Sj, and a part of the signal conversion circuit 40. As shown in FIG. 2, the pixel circuit 20 in the i-th row and the j-th column includes transistors 21 to 23, an organic EL element 24, and a capacitor 25, and is connected to scanning lines GAi, GBi and the data line Sj. The transistors 21 to 23 are N-channel type TFTs.

The high-level power supply voltage ELVDD is applied to a drain terminal of the transistor 21. A source terminal of the transistor 21 is connected to an anode terminal of the organic EL element 24. The low-level power supply voltage ELVSS is applied to a cathode terminal of the organic EL element 24. One conduction terminals of the transistors 22, 23 (left-side terminals in FIG. 2) are connected to the data line Sj. The other conduction terminal of the transistor 22 is connected to a gate terminal of the transistor 21, and a gate terminal of the transistor 22 is connected to the scanning line GAi. The other conduction terminal of the transistor 23 is connected to the source terminal of the transistor 21 and the anode terminal of the organic EL element 24, and a gate terminal of the transistor 23 is connected to the scanning line GBi. The capacitor 25 is provided between the gate terminal and the drain terminal of the transistor 21. The transistors 21 to 23 function as a drive transistor, a write control transistor, and a read control transistor, respectively.

The m output/measurement circuits 30 are provided corresponding to the m data lines S1 to Sm. The output/measurement circuit 30 corresponding to the data line Sj includes an operational amplifier 31, a capacitor 32, a current source 33, and switches 34 to 37, and is connected to the data line Sj. The capacitor 32 has a first terminal (left-side terminal in FIG. 2) and a second terminal (right-side terminal in FIG. 2). An inverting input terminal of the operational amplifier 31 is connected to the first terminal of the capacitor 32, and an output terminal of the operational amplifier 31 is connected to the second terminal of the capacitor 32. An output signal DVj of a D/A convertor (not shown) corresponding to the data line Sj is applied to a non-inverting input terminal of the operational amplifier 31. The switch 36 is provided between the first terminal and the second terminal of the capacitor 32. One end (left end in FIG. 2) of the switch 34 and one end (upper end in FIG. 2) of the switch 35 are connected to the data line Sj. A predetermined voltage V0 is applied to the other end of the switch 34. The other end of the switch 35 and one end (upper end in FIG. 2) of the switch 37 are connected to the first terminal of the capacitor 32. The current source 33 is connected to the other end of the switch 37. The switches 34 to 37 respectively turn on when switch control signals SC1 to SC4 are at a high level.

The data lines S1 to Sm are classified into (m/p) groups, each group including p data lines. The signal conversion circuit 40 includes (m/p) selectors 41, (m/p) voltage comparators 42, and (m/p) counters 43. The selector 41, the voltage comparator 42, and the counter 43 are corresponded to one group of the data lines. The selector 41 has p input terminals. The p input terminals of the selector 41 are connected to second terminals of p pieces of the capacitors 32. The selector 41 sequentially selects one voltage from among voltages of the second terminals of the p capacitors 32. The voltage comparator 42 compares the voltage (hereinafter referred to as Vx) selected by the selector 41 with a comparison target voltage Vcomp (details will be described later) determined in advance, and outputs a binary signal Cres indicating a comparison result. Here, it is assumed that the signal Cres is at a high level when Vx>Vcomp is satisfied and is at a low level when Vx≤Vcomp is satisfied. The signal Cres and a clock signal CLK having a predetermined cycle are input to the counter 43. When the clock signal CLK changes to a predetermined direction (for example, to the high level), the counter 43 adds one to a count value when the signal Cres is at the high level, and does not update the count value when the signal Cres is at the low level.

In the data line drive/current measurement circuit 14, the switches 35 to 37 function as a third switch, a first switch, and a second switch, respectively. The current source 33 is connected to the other end of the switch 37 so as to be electrically connectable to the first terminal of the capacitor, and functions as a discharge circuit for discharging charge accumulated in the capacitor 32 at a constant speed. The voltage comparator 42 compares a voltage of the second terminal of the capacitor 32 with the comparison target voltage Vcomp. The counter 43 switches whether to update the count value in accordance with the comparison result by the voltage comparator 42. The voltage comparator 42 and the counter 43 measure the current flowing through the pixel circuit 20 by measuring time until the voltage of the second terminal of the capacitor 32 reaches the comparison target voltage Vcomp.

In order to correct the video signal VS1 to obtain the video signal VS2, the data line drive/current measurement circuit 14 measures four kinds of currents with respect to each pixel circuit 20. More specifically, in order to obtain characteristics of the transistor 21 in each pixel circuit 20, the data line drive/current measurement circuit 14 measures a current Im1 flowing out from the pixel circuit 20 when a first measurement voltage Vm1 is written to the pixel circuit 20, and a current Im2 flowing out from the pixel circuit 20 when a second measurement voltage Vm2 (>Vm1) is written to the pixel circuit 20. Furthermore, in order to obtain characteristics of the organic EL element 24 in each pixel circuit 20, the data line drive/current measurement circuit 14 measures a current Im3 flowing into the pixel circuit 20 when a third measurement voltage Vm3 is written to the pixel circuit 20, and a current Im4 flowing into the pixel circuit 20 when a fourth measurement voltage Vm4 (>Vm3) is written to the pixel circuit 20. Hereinafter, measuring the currents Im1, Im2 is referred to as "detecting characteristics of the drive transistor", and measuring the currents Im3, Im4 is referred to as "detecting characteristics of the organic EL element".

The scanning line drive circuit 13 and the data line drive/current measurement circuit 14 perform a processing for writing to the pixel circuits 20 in one row and a processing for measuring one of four kinds of the currents Im1 to Im4. The scanning line drive circuit 13 and the data line drive/current measurement circuit 14 may measure the currents while display is stopped, or may measure the currents while displaying. As a method for measuring the currents while displaying, there are a method for providing one or more line periods longer than a normal case in one frame period and measuring the currents with respect to the pixel circuits in one row in the long line period(s), a method for measuring the currents with respect to the pixel circuits in one or more rows in a vertical blanking period in one frame period, and the like.

Here, the comparison target voltage Vcomp supplied to the voltage comparator 42 will be described. Since the data line drive/current measurement circuit 14 measures one of the currents Im1 to Im4, a range of a voltage Vx before the switch 37 turns on can be predicted in advance (hereinafter, the predicted range of the voltage Vx is assumed to be Vxmin≤Vx≤Vxmax). Furthermore, a voltage (hereinafter referred to as voltage Vx0) of the second terminal of the capacitor 32 after the switch 37 turns on and all charge accumulated in the capacitor 32 are discharged can also be known in advance. In this case, the comparison target voltage Vcomp may be determined in a range of Vx0≤Vcomp≤Vxmin. For example, the voltage Vx0, the voltage Vxmin, or a voltage slightly lower than the voltage Vxmin may be used as the comparison target voltage Vcomp. Furthermore, the data line drive/current measurement circuit 14 may switch the comparison target voltage Vcomp in accordance with which one of the currents Im1 to Im4 is measured.

Figure 3:
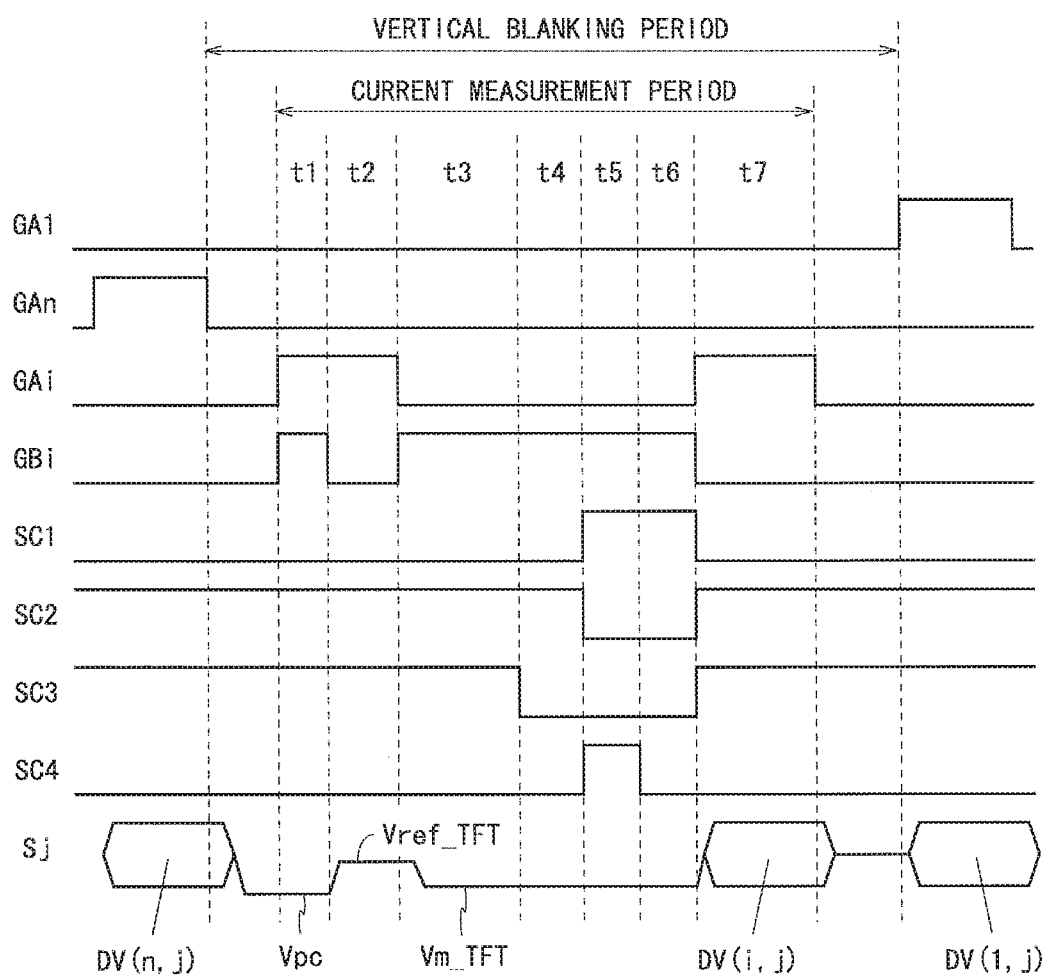
FIG. 3 is a timing chart of the display device shown in FIG. 1 when detecting characteristics of a drive transistor.

In the following, there will be described a case in which the currents are measured with respect to the pixel circuits in one row in a vertical blanking period. FIG. 3 is a timing chart when detecting the characteristics of the drive transistor. FIG. 3 depicts a current measurement period of the pixel circuits 20 in the i-th row settled in the vertical blanking period. The current measurement period includes a reset period t1, a reference voltage write period t2, a measurement voltage write period t3, a charge period t4, a discharge/measurement period t5 (period for performing discharge and measurement), a discharge/measurement period t6 for another column, and a data write period t7. Hereinafter, signals on the scanning lines GAi, GBi are referred to as scanning signals GAi, GBi, respectively.

Before the period t1, the scanning signals GAi, GBi and the switch control signals SC1, SC4 are at the low level, and the switch control signals SC2, SC3 are at the high level. At this time, the transistors 22, 23 in the pixel circuits 20 in the i-th row turn off. In the output/measurement circuit 30, the switches 34, 37 turn off and the switches 35, 36 turn on.

In the period t1, the scanning signals GAi, GBi become the high level and the voltage DVj becomes a precharge voltage Vpc. The precharge voltage Vpc is determined so that the transistor 21 turns off. Especially, it is desirable that the precharge voltage Vpc be determined as high as possible in a range where both a drive transistor (transistor 21) and the organic EL element 24 turns off (the reason will be described later). In the period t1, in the pixel circuits 20 in the i-th row, the transistors 22, 23 turn on, and the precharge voltage Vpc is applied to the gate terminal and the source terminal of the transistor 21 and the anode terminal of the organic EL element 24. With this, the transistor 21 and the organic EL element 24 in the pixel circuits 20 in the i-th row are initialized.

For example, when the transistor 21 is formed using a semiconductor oxide such as an InGaZnO (Indium Gallium Zinc Oxide), the transistor 21 may have hysteresis characteristics. If the transistor 21 is used without an initialization in this case, a current measurement result may vary depending on a previous display status. By providing the reset period t1 at the start of the selection period when measuring current and initializing the transistor 21 in the reset period t1, variation of the current measurement result due to the hysteresis characteristics can be prevented. Note that since the organic EL element 24 does not have the hysteresis characteristics, it is not necessary to provide the reset period t1 when detecting the characteristics of the organic EL element. Furthermore, when the current is measured not when displaying but in a non-display state just after power on or during display off, the reset period may be omitted.

In the period t2, the scanning signal GAi becomes the high level, the scanning signal GBi becomes the low level, and the voltage DVj becomes a reference voltage Vref_TFT. In the period t2, in the pixel circuit 20 in the i-th row and the j-th column, the transistor 22 turns on, the transistor 23 turns off, and the reference voltage Vref_TFT is applied to the gate terminal of the transistor 21. The reference voltage Vref_TFT is determined to be a high voltage so that the transistor 21 turns on in the periods t3 to t6.

In the period t3, the scanning signal GAi becomes the low level, the scanning signal GBi becomes the high level, and the voltage DVj becomes one of the first and second measurement voltages Vm1, Vm2 (depicted as Vm_TFT in FIG. 3). In the period t3, in the pixel circuit 20 in the i-th row and the j-th column, the transistor 22 turns off, the transistor 23 turns on, and one of the first and second measurement voltages Vm1, Vm2 is applied to the anode terminal of the organic EL element 24. At this time, the transistor 21 turns on, and a current flows from the power supply line or the power supply electrode having the high-level power supply voltage ELVDD through the transistors 21, 23 to the data line Sj. When some time passes after the start of the period t3, the data line Sj is charged to a predetermined voltage level, and a current flowing out from the pixel circuit 20 to the data line Sj becomes constant.

Note that in a case where a source potential of the transistor 21 in the period t2 is low when detecting the characteristics of the drive transistor, a gate-source voltage of the transistor 21 becomes large at the start of the period t3, a large current flows through the transistor 21, and the organic EL element 24 emits light. In order to prevent emitting light at this time, as described above, the precharge voltage Vpc applied in the period t1 is determined to be high in a range where both the drive transistor and the organic EL element 24 turn off.

In the period t4, the scanning signals GAi, GBi and the voltage DVj keep the same level as in the period t3, and the switch control signal SC3 becomes the low level. Accordingly, the switch 36 turns off, and the output terminal and the inverting input terminal of the operational amplifier 31 are connected via the capacitor 32. At this time, the operational amplifier 31 and the capacitor 32 function as an integration amplifier. The voltage of the second terminal of the capacitor 32 at the end of the period t4 is determined by an amount of the current flowing through the pixel circuit 20 in the i-th row and the j-th column and the data line Sj, a capacitance of the capacitor 32, a length of the period t4, and the like. The capacitor 32 is charged with charge of the current flowing through the pixel circuit 20 and the data line Sj in the period t4. The amount of charge accumulated in the capacitor 32 at this time does not depend on the capacitance of the capacitor 32.

In the period t5, the switch control signals SC1, SC4 become the high level, and the switch control signal SC2 becomes the low level. Accordingly, the switches 34, 37 turn on and the switch 35 turns off. Thus, the data line Sj is electrically disconnected from the first terminal of the capacitor 32, and the voltage V0 is applied to the data line Sj. The voltage V0 is determined so that the organic EL element 24 does not emit light in the period t5. With this, it is possible to prevent unnecessary light emission of the organic EL element 24.

Furthermore, in the period t5, the first terminal of the capacitor 32 is electrically connected to one end of the current source 33. A constant current Iref flows through the current source 33. Thus, the charge accumulated in the capacitor 32 decreases at a constant speed, and a voltage of the first terminal of the capacitor 32 decreases at a constant speed. Accordingly, the voltage of the second terminal of the capacitor 32 also decreases at a constant speed.

In the period t5, the selector 41 selects the voltage of the second terminal of the capacitor 32 corresponding to the data line Sj. The voltage comparator 42 compares the output voltage Vx of the selector 41 with the voltage Vcomp. The counter 43 adds one to the count value while Vx>Vcomp is satisfied. Thus, the count value of the counter 43 corresponds to time until the output voltage Vx of the selector 41 reaches the voltage Vcomp. Since the output voltage Vx of the selector 41 decreases at a constant speed by an action of the current source 33, the count value of the counter 43 also corresponds to the amount of current flowing through the pixel circuit 20 in the period t4. Therefore, it is possible to measure the current flowing through the pixel circuit 20 in the i-th row and the j-th column in the period t4 using the current measurement circuit (output/measurement circuit 30 and signal conversion circuit 40) shown in FIG. 2.

In the period t6, the switch control signal SC4 becomes the low level. Accordingly, the switch 37 turns off. At this time, the selector 41 selects the voltage of the second terminal of the capacitor 32 corresponding to another data line Sk in the same group (where k is an integer not less than 1, not more than m, and not j such that an integer part of $(k+p-1)/p$ equals to an integer part of $(j+p-1)/p$). In the period t6, the current measurement circuit shown in FIG. 2 measures the current flowing through the pixel circuit 20 in the i-th row and the k-th column in the period t4.

In the period t7, the scanning signal GAi becomes the high level, the scanning signal GBi becomes the low level, and the voltage DVj becomes a data voltage DV(i,j) to be written to the pixel circuit 20 in the i-th row and the j-th column. In the period t7, in the pixel circuit 20 in the i-th row and the j-th column, the transistor 22 turns on, and the data voltage DV (i, j) is applied to the gate terminal of the transistor 21. When the scanning signal GAi changes to the low level at the end of the period t7, the transistor 22 in the pixel circuit 20 in the i-th row and the j-th column turns off. After that, in the pixel circuit 20 in the i-th row and the j-th column, the gate voltage of the transistor 21 is kept at DV(i,j) by an action of the capacitor 25.

A timing chart when detecting characteristics of the organic EL element is similar to that shown in FIG. 3. However, when detecting the characteristics of the organic EL element, a reference voltage Vref_OLED for the organic EL element is applied to the data line Sj in the period t2, and a measurement voltage Vm_OLED for the organic EL element (one of the third and fourth measurement voltages Vm3, Vm4) is applied to the data line Sj in the periods t3 to t6. Furthermore, a level of the voltage Vcomp supplied to the voltage comparator 42 may be changed. The reference voltage Vref_OLED is determined so that the transistor 21 turns off in the period t2, and the measurement voltage Vm_OLED is determined so that the current flows through the organic EL element 24 in the periods t3 to t6.

Note that a direction of the current flowing through the data line Sj is opposite between when detecting the characteristics of the drive transistor and when detecting the characteristics of the organic EL element. Thus, it is desirable that a direction of the current flowing through the current source 33 be opposite between when detecting the characteristics of the drive transistor and when detecting the characteristics of the organic EL element. However, even if the direction of the current flowing through the current source 33 is the same between when detecting the characteristics of the drive transistor and when detecting the characteristics of the organic EL element, it is possible to detect the characteristics of the drive transistor and the organic EL element by suitably adjusting the level of the voltage Vcomp to be supplied to the voltage comparator 42.

In the current measurement circuit shown in FIG. 2, the amount of charge accumulated in the capacitor 32 at the end of the period t4 and a change speed of the voltage of the second terminal of the capacitor 32 in the period t5 do not depend on the capacitance of the capacitor 32. Thus, the count value of the counter 43 also does not depend on the capacitance of the capacitor 32. Therefore, according to the display device 10 of the present embodiment, it is possible to measure the current flowing through the pixel circuit 20 based on the voltage of the second terminal of the capacitor 32, without being affected by the capacitance of the capacitor 32. Therefore, it is possible to compensate for capacitance variation of the capacitor 32 in the current measurement circuit and perform high image quality display by correcting the video signal VS1 based on the current measurement result.

Note that in the current measurement circuit shown in FIG. 2, when a maximum current flows through the pixel circuit 20 in the period t4, a same amount of current needs to flow through the current source 33 in the period t5. Thus, it is necessary to set the current Iref flowing through the current source 33 to be larger than the maximum current flowing through the pixel circuit 20. With this, it is possible to sufficiently discharge the charge accumulated in the capacitor 32 in the discharge period t5, and measure the current flowing through the pixel circuit 20 correctly. Furthermore, in order to shorten the current measurement period, it is desirable that an amount of the current Iref flowing through the current source 33 be large.

In the display device 10, the first to fourth measurement voltages Vm1 to Vm4 are determined for each pixel circuit 20 and are changed in accordance with the characteristics of the elements in the pixel circuit 20. The first to fourth measurement voltage storing units 15a to 15d store the first to fourth measurement voltages Vm1 to Vm4 with respect to each pixel circuit 20, respectively. On the other hand, reference values (reference currents) of the currents Im1 to Im4 are fixedly determined in advance. Hereinafter, square roots of the reference values of the currents Im1, Im2 are referred to as first and second current data SQI1, SQI2, respectively, and K-th roots (K is a constant not less than 2 and not more than 3) of the reference values of the currents Im3, Im4 are referred to as third and fourth current data KRI3, KRI4, respectively.

Figure 4:
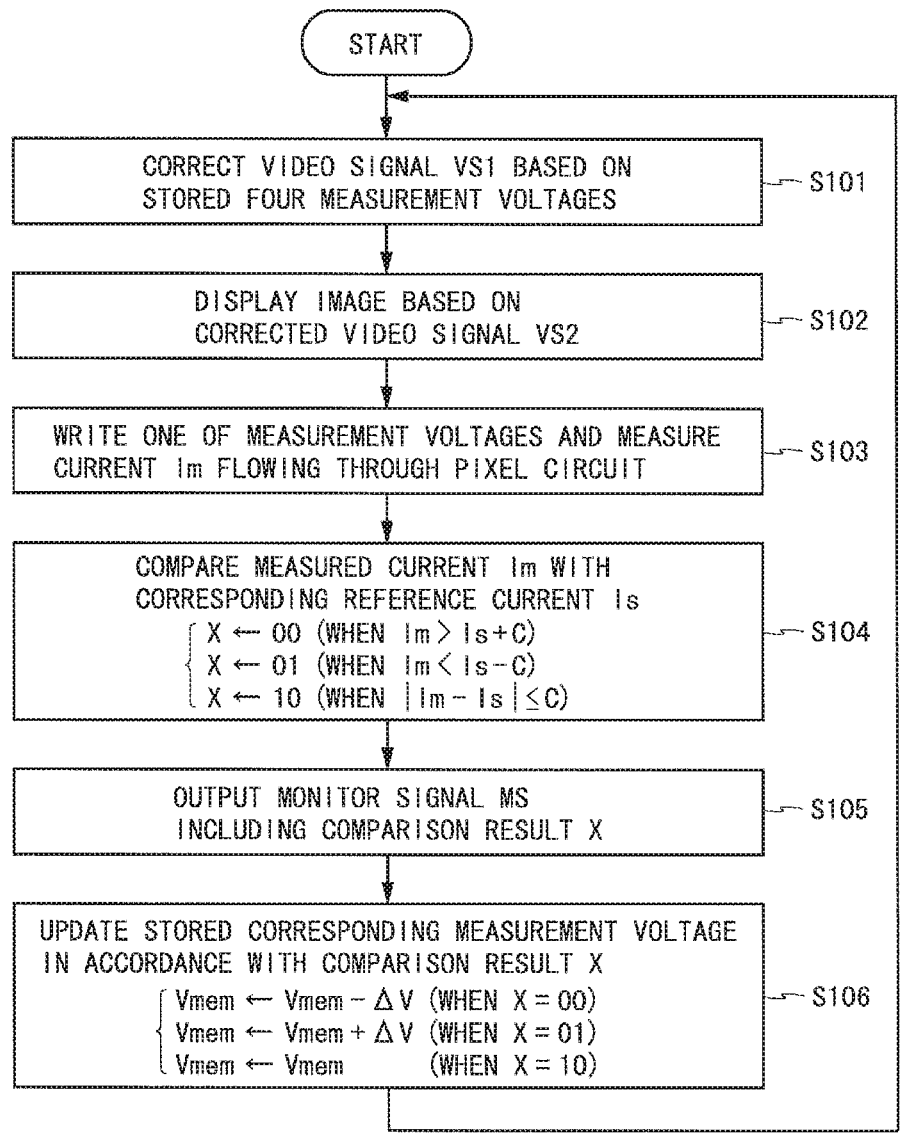
FIG. 4 is a flowchart showing operations of the display device shown in FIG. 1.

FIG. 4 is a flowchart showing operations of the display device 10. The scanning line drive circuit 13, the data line drive/current measurement circuit 14, and the correction unit 16 included in the display device 10 repeatedly perform steps S101 to S106 shown below.

Figure 5:
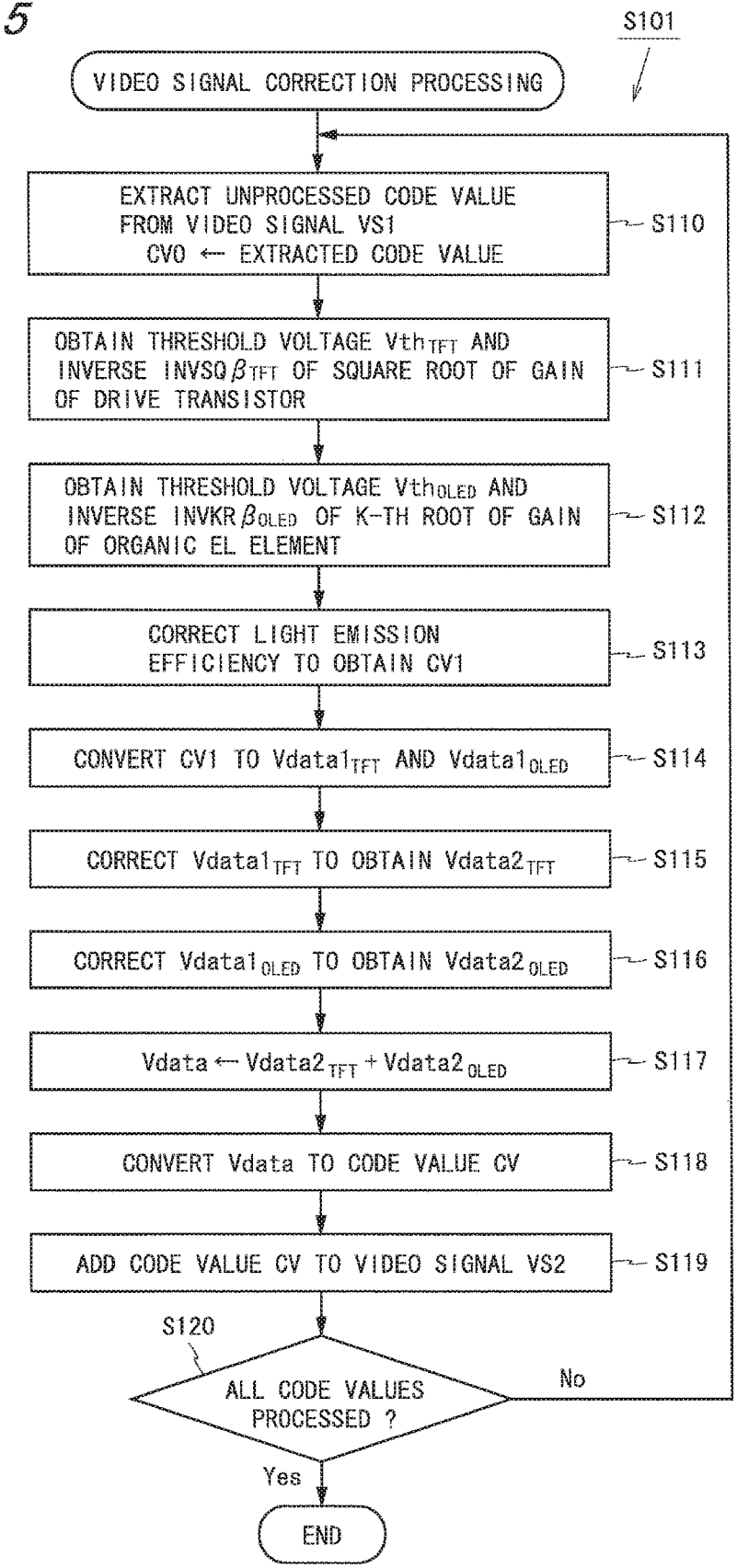
FIG. 5 is a flowchart showing details of step S101 shown in FIG. 4.

The correction unit 16 obtains the corrected video signal VS2 by correcting the video signal VS1 based on the first to fourth measurement voltages Vm1 to Vm4 stored in the measurement voltage storing unit 15 (step S101). More specifically, in step S101, the correction unit 16 performs a processing shown in FIG. 5. In the following, gate-source voltages of the transistor 21 when the first and second measurement voltages Vm1, Vm2 are written to the pixel circuit 20 are assumed to be Vgsm1, Vgsm2, respectively, and anode-cathode voltages of the organic EL element 24 when the third and fourth measurement voltages Vm3, Vm4 are written to the pixel circuit 20 are assumed to be Vom3, Vom4, respectively.

The correction unit 16 extracts an unprocessed code value from the video signal VS1 (step S110). Hereinafter, the code value extracted from the video signal VS1 in step S110 is referred to as CV0.

Next, the correction unit 16 obtains a threshold voltage $Vth_{TFT}$ of the transistor 21 and an inverse $INVSQ\beta_{TFT}$ of a square root of a gain of the transistor 21, by performing calculations shown in the following equations (1a) and (1b) on the voltages Vgsm1, Vgsm2, the first current data SQI1, and the second current data SQI2 (step S111).

$$Vth_{TFT} = \frac{Vgsm1 \times SQI2 - Vgsm2 \times SQI1}{SQI2 - SQI1} \tag{1a}$$

$$INVSQ\beta_{TFT} = \frac{Vgsm2 - Vgsm1}{SQI2 - SQI1} \tag{1b}$$

Next, the correction unit 16 obtains a threshold voltage $Vth_{OLED}$ of the organic EL element 24 and an inverse $INVKR\beta_{OLED}$ of a K-th root of a gain of the organic EL element 24, by performing calculations shown in the following equations (2a) and (2b) on the voltages Vom3, Vom4, the third current data KRI3, and the fourth current data KRI4 (step S112).

$$Vth_{OLED} = \frac{Vom3 \times KRI4 - Vom4 \times KRI3}{KRI4 - KRI3} \tag{2a}$$

$$INVKR\beta_{OLED} = \frac{Vom4 - Vom3}{KRI4 - KRI3} \tag{2b}$$

In the present embodiment, all of the first to fourth current data SQI1, SQI2, KRI3, KRI4 are constants. Therefore, since denominators of the equations (1a), (1b), (2a), and (2b) are constants, the calculations in steps S111, S112 can be performed only by subtractions and multiplications.

Next, the correction unit 16 performs a processing for correcting a light emission efficiency of the organic EL element 24 (step S113). Specifically, the correction unit 16 obtains a corrected code value CV1 by performing a calculation shown in the following equation (3).

$$CV1 = CV0 \times \gamma \tag{3}$$

In the equation (3), γ represents a light emission efficiency correction coefficient determined with respect to each pixel circuit 20. The light emission efficiency correction coefficient γ has a larger value, as the light emission efficiency of the organic EL element 24 in a pixel degrades more. Note that as a method for obtaining γ, there are a method of referring to a table prepared in advance and a method of obtaining by a calculation.

Next, the correction unit 16 converts the corrected code value CV1 to a voltage value $Vdata1_{TFT}$ representing the gate-source voltage of the transistor 21 and a voltage value $Vdata1_{OLED}$ representing the anode-cathode voltage of the organic EL element 24 (step S114). Conversion in step S114 is performed, for example, by a method of referring to a table prepared in advance or a method of calculating using a calculation unit.

Next, the correction unit 16 obtains a corrected voltage value $Vdata2_{TFT}$ by performing a calculation shown in the following equation (4) on the voltage value $Vdata1_{TFT}$ (step S115).

$$Vdata2_{TFT} = INVSQ\beta_{TFT} \times SQ\beta0_{TFT} \times Vdata1_{TFT} + Vth_{TFT} \tag{4}$$

Here, $SQ\beta0_{TFT}$ included in the equation (4) represents a square root of an average value of an initial value of the gain of the transistor 21.

Next, the correction unit 16 obtains the corrected voltage value $Vdata2_{OLED}$ by performing a calculation shown in the following equation (5) on the voltage value $Vdata1_{OLED}$ (step S116).

$$Vdata2_{OLED} = INVKR\beta_{OLED} \times KR\beta0_{OLED} \times Vdata1_{OLED} + Vth_{OLED} \quad (5)$$

Here, $KR\beta0_{OLED}$ included in the equation (5) represents a K-th root of an average value of an initial value of the gain of the organic EL element 24.

Next, the correction unit 16 adds the corrected voltage value $Vdata2_{TFT}$ obtained in step S115 to the corrected voltage value $Vdata2_{OLED}$ obtained in step S116 in accordance with the following equation (6). With this, a voltage value Vdata representing a voltage to be applied to the gate terminal of the transistor 21 is obtained (step S117).

$$Vdata = V2data_{TFT} + V2data_{OLED} \quad (6)$$

Next, the correction unit 16 converts the voltage value Vdata to an output code value CV (step S118). Conversion in step S118 is performed by a method similar to that in step S114.

Next, the correction unit 16 adds the output code value CV obtained in step S118 to the video signal VS2 (step S119). Next, the correction unit 16 determines whether all the code values included in the video signal VS1 have been processed (step S120). The correction unit 16 goes to step S110 when No is determined in step S120, and finishes the processing of step S101 otherwise.

Next, the scanning line drive circuit 13 and the data line drive/current measurement circuit 14 display an image based on the corrected video signal VS2 (step S102). More specifically, the scanning line drive circuit 13 sequentially selects one scanning line from among the scanning lines GA1 to GAn, and applies the selection voltage to the selected scanning line. The data line drive/current measurement circuit 14 applies m data voltages in accordance with the video signal VS2 obtained by the correction unit 16 to the data lines S1 to Sm, respectively.

Next, the scanning line drive circuit 13 and the data line drive/current measurement circuit 14 write one of the first to fourth measurement voltages Vm1 to Vm4 to the pixel circuits 20 in one row, and measures the current Im flowing through each of the pixel circuits 20 at that time (step S103). The first to fourth measurement voltages Vm1 to Vm4 written to the pixel circuit 20 in the i-th row and the j-th column in step S103 are the first to fourth measurement voltages for the pixel circuit 20 in the i-th row and the j-th column, the voltages stored in the first to fourth measurement voltage storing units 15a to 15d, respectively.

Next, the data line drive/current measurement circuit 14 compares the current Im measured in step S103 with a corresponding reference current Is (step S104). Here, the corresponding reference current Is is one of reference values of the currents Im1 to Im4 (one of a square value of the first current data SQI1, a square value of the second current data SQI2, a K-th power value of the third current data KRI3, and a K-th power value of the fourth current data KRI4), and is fixedly held in the data line drive/current measurement circuit 14. Assuming that C is a constant, the data line drive/current measurement circuit 14 sets a comparison result X to "00" (binary representation, the same applies to the following) when Im>Is+C is satisfied, sets the comparison result X to "01" when Im<Is+C is satisfied, and sets the comparison result X to "10" when |Im−Is|≤C is satisfied. Note that the data line drive/current measurement circuit 14 may use the signal conversion circuit 40 or may use the drive/measurement signal generation circuit 17, when performing step S104.

Next, the data line drive/current measurement circuit 14 outputs the monitor signal MS including the comparison result X, to the display control circuit 12 (step S105). Receiving the monitor signal MS, the display control circuit 12 supplies the comparison result X included in the monitor signal MS to the correction unit 16.

Next, the correction unit 16 updates a corresponding measurement voltage stored in the measurement voltage storing unit 15, in accordance with the comparison result X (step S106). For example, when the first measurement voltage Vm1 is written to the pixel circuit 20 in the i-th row and the j-th column, the first measurement voltage Vm1 for the pixel circuit 20 in the i-th row and the j-th column stored in the first measurement voltage storing unit 15a is updated as follows. When the comparison result X is "00", a predetermined value ΔV is subtracted from the first measurement voltage Vm1. When the comparison result X is "01", the predetermined value ΔV is added to the first measurement voltage Vm1. When the comparison result X is "10", the first measurement voltage Vm1 is not updated. When the second to fourth measurement voltages Vm2 to Vm4 are written to the pixel circuit 20 in the i-th row and the j-th column, the second to fourth measurement voltages Vm2 to Vm4 for the pixel circuit 20 in the i-th row and the j-th column stored in the second to fourth measurement voltage storing units 15b to 15d are updated by a similar method. The measurement voltage updated in step S106 is used when performing step S101 next time.

In this manner, in the display device 10, the reference values of the currents Im1 to Im4 are fixedly determined in advance, and the first to fourth measurement voltages Vm1 to Vm4 are updated so that the measured current Im matches to the corresponding reference current Is. With this, it is possible to obtain the first to fourth measurement voltages Vm1 to Vm4, and obtain the characteristics of the transistor 21 and the organic EL element 24. Furthermore, the processing shown in FIGS. 4 and 5 do not include a calculation for obtaining a square root or a division. Therefore, it is possible to facilitate the calculation in the correction unit 16 and use an output range of the output/measurement circuit 30 effectively. Furthermore, the comparison result X obtained in step S104 can be represented by two bits. Therefore, when outputting the monitor signal MS including the comparison result X in step S105, an amount of data transmitted from the data line drive/current measurement circuit 14 to the display control circuit 12 can be reduced.

As described above, the display device 10 according to the present embodiment includes the display unit 11 including the plurality of the scanning lines GA1 to GAn, GB1 to GBn, the plurality of the data lines S1 to Sm, and the plurality of the pixel circuits 20 arranged two-dimensionally, the scanning line drive circuit 13 for driving the scanning lines GA1 to GAn, GB1 to GBn, a data line drive circuit (a part of the data line drive/current measurement circuit 14) for driving the data lines S1 to Sm, a current measurement circuit (another part of the data line drive/current measurement circuit 14) for measuring the current flowing through the pixel circuit 20, and the correction unit 16 for correcting the video signal VS1 to be supplied to the data line drive circuit, based on the current measured by the current measurement circuit. The current measurement circuit includes the capacitor 32 charged with the charge of the current flowing through the pixel circuit 20, and a discharge circuit (current source 33) for discharging the charge accumulated in the capacitor 32 at a constant speed. In the display device 10, the capacitor 32 is charged with the charge of the current flowing through the pixel circuit 20, and then the charge accumulated in the capacitor 32 is discharged at a constant speed. An amount of the charge accumulated in the capacitor 32 and a change speed of a terminal voltage of the capacitor 32 when discharging do not depend on the capacitance of the capacitor 32. Thus, it is possible to accurately measure the current flowing through the pixel circuit 20 based on the terminal voltage of the capacitor 32 without being affected by the capacitance of the capacitor 32. Therefore, it is possible to compensate for capacitance variation of the capacitor 32 in the current measurement circuit and perform high image quality display by correcting the video signal VS1 based on the current measurement result.

Furthermore, the discharge circuit is provided so as to be electrically connectable to the first terminal of the capacitor 32, and the current measurement circuit measures the current flowing through the pixel circuit 20 by measuring time until the voltage of the second terminal of the capacitor reaches the comparison target voltage Vcomp. The current measurement circuit includes the operational amplifier 31 having the inverting input terminal connected to the first terminal of the capacitor 32 and the output terminal connected to the second terminal of the capacitor 32, a first switch (switch 36) provided between the first terminal and the second terminal of the capacitor 32, a second switch (switch 37) having one end connected to the first terminal of the capacitor 32, the voltage comparator 42 for comparing the voltage of the second terminal of the capacitor 32 with the comparison target voltage Vcomp, and the counter 43 for switching whether to update the count value in accordance with the comparison result by the voltage comparator 42. The discharge circuit is the current source 33 connected to the other end of the second switch. By actions of the first and second switches, the capacitor 32 is charged with the charge of the current flowing through the pixel circuit 20, and then the charge accumulated in the capacitor 32 is discharged at a constant speed. Furthermore, the time until the voltage of the second terminal of the capacitor 32 reaches the comparison target voltage Vcomp can be obtained using the voltage comparator 42 and the counter 43. Therefore, it is possible to accurately measure the current flowing through the pixel circuit 20 based on the voltage of the second terminal of the capacitor 32 without being affected by the capacitance of the capacitor 32.

Furthermore, the current measurement circuit includes a third switch (switch 35) having one end connected to the data line Sj and the other end connected to the first terminal of the capacitor 32. When the third switch is controlled to be in a non-conduction state, the current measurement circuit is electrically disconnected from the data line Sj. The current flowing through the pixel circuit 20 can be measured by discharging the charge accumulated in the capacitor 32 in this state.

Furthermore, the current measurement circuit includes the selector 41 for selecting one voltage from among voltages of second terminals of a plurality of the capacitors 32 and outputting a selected voltage to the voltage comparator 42. A number of the voltage comparators 42 and the counters 43 in the current measurement circuit can be reduced by providing the selector 41 in this manner. Furthermore, the current Iref flowing through the current source 33 is larger than the maximum current flowing through the pixel circuit 20. Therefore, it is possible to sufficiently discharge the charge accumulated in the capacitor 32 in the discharge period and correctly measure the current flowing through the pixel circuit 20.

Furthermore, the pixel circuit 20 includes an electro-optical element (organic EL element 24), a drive transistor (transistor 21) connected in series with the electro-optical element, a write control transistor (transistor 22) having a first conduction terminal connected to the data line Sj, a second conduction terminal connected to a control terminal of the drive transistor, and a control terminal (gate terminal) connected to a first scanning line GAi in the scanning lines, and a read control transistor (transistor 23) having a first conduction terminal connected to the data line Sj, a second conduction terminal connected to a connection point of the drive transistor and the electro-optical element, and a control terminal connected to a second scanning line GBi in the scanning lines. Therefore, it is possible to compensate for the capacitance variation of the capacitor 32 in the current measurement circuit and perform high image quality display in the display device having the pixel circuit including the electro-optical element, the drive transistor, the write control transistor, and the read control transistor.

Furthermore, the display device 10 includes a storing unit (measurement voltage storing unit 15) for storing the plurality of the measurement voltages with respect to the electro-optical element and the drive transistor for each pixel circuit 20, and the correction unit 16 corrects the video signal VS1 based on the measurement voltages Vm1 to Vm4 stored in the storing unit. Therefore, it is possible to obtain the characteristics (threshold voltage and gain) of the electro-optical element and the drive transistor for each pixel circuit 20 based on the stored measurement voltages Vm1 to Vm4 and correct the video signal VS1 using the obtained characteristics. Furthermore, the correction unit 16 updates the measurement voltages Vm1 to Vm4 stored in the storing unit, in accordance with the result obtained by comparing the current Im measured by the current measurement circuit with the reference current Is. With this, the measurement voltages Vm1 to Vm4 can be obtained easily.

The current measurement period of the pixel circuit 20 sequentially includes a first period (period t3) in which the measurement voltage is applied to the non-inverting input terminal of the operational amplifier 31, the first and third switches are in a conduction state, and the second switch is in the non-conduction state, a second period (period t4) in which the first switch is in the non-conduction state, and a third period (period t5) in which the second switch is in the conduction state and the third switch is in the non-conduction state. By sequentially controlling the states of the first to third switches in this manner, it is possible to charge the capacitor 32 with the charge of the current flowing through the pixel circuit 20, and discharge the charge accumulated in the capacitor 32 at a constant speed. Therefore, the current flowing through the pixel circuit 20 can be measured accurately without being affected by the capacitance of the capacitor 32.

Furthermore, the current measurement period of the pixel circuit 20 includes, after the third period, a period (period t7) in which the data voltage in accordance with the video signal VS2 is applied to the non-inverting input terminal of the operational amplifier 31, the first and third switches are in the conduction state, and the second switch is in the non-conduction state. It is possible to write the data voltage to the pixel circuit 20 and display an image in accordance with the video signal VS2 immediately after measuring the current, by applying the data voltage to the data line Sj after measuring the current in this manner. Furthermore, the current measurement period of the pixel circuit 20 includes, before the first period, a period (period t1) in which the precharge voltage Vpc is applied to the non-inverting input terminal of the operational amplifier 31, the first and third switches are in the conduction state, and the second switch is in the non-conduction state. Elements in the pixel circuit 20 can be initialized before measuring the current by applying the precharge voltage Vpc to the data lines before measuring the current in this manner.

(Second Embodiment)

Figure 6:
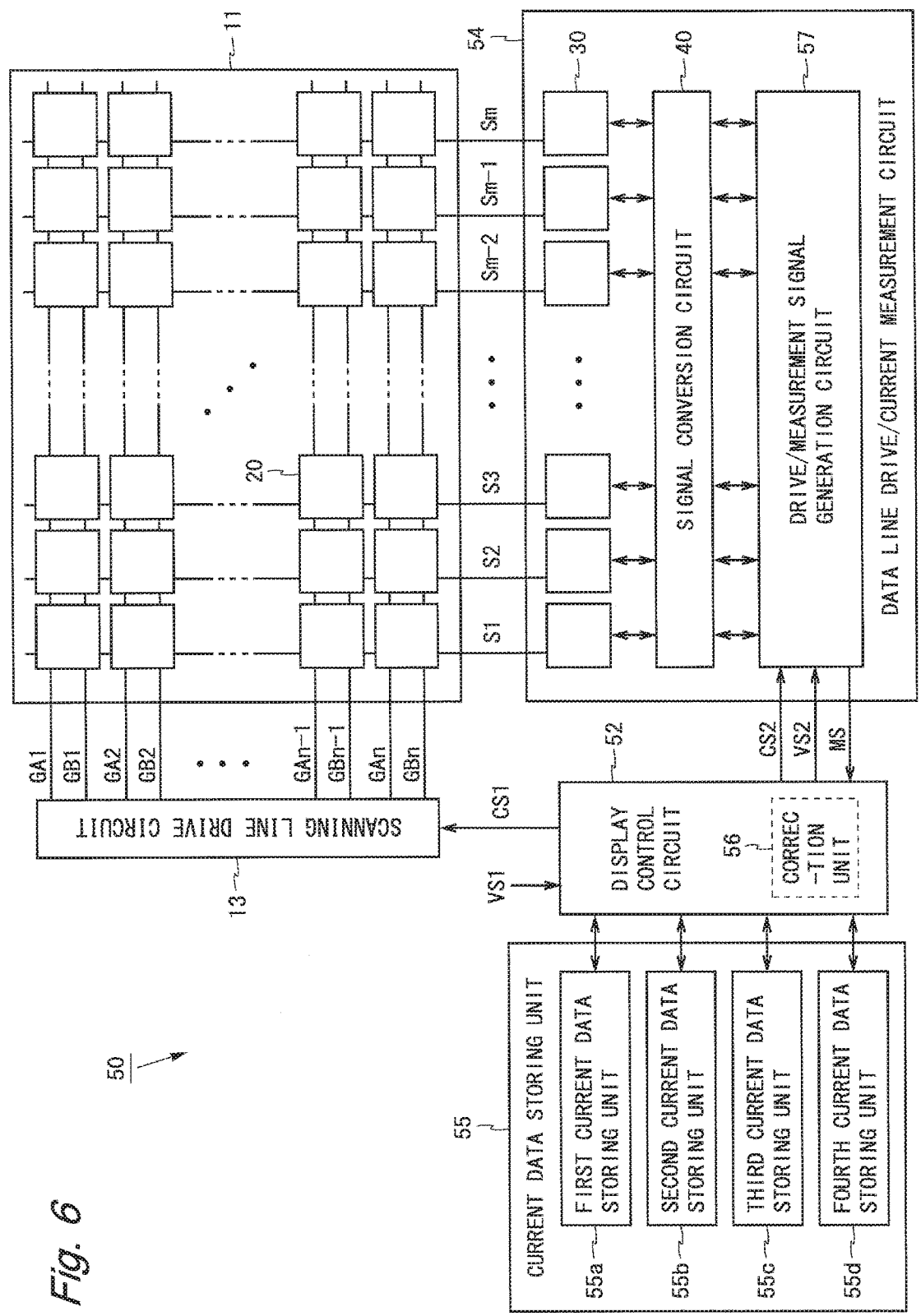
FIG. 6 is a block diagram showing a configuration of a display device according to a second embodiment of the present invention.

FIG. 6 is a block diagram showing a configuration of a display device according to a second embodiment of the present invention. A display device 50 shown in FIG. 6 includes the display unit 11, a display control circuit 52, the scanning line drive circuit 13, a data line drive/current measurement circuit 54, and a current data storing unit 55. The display control circuit 52 includes a correction unit 56 in place of the correction unit 16. The data line drive/current measurement circuit 54 includes a drive/measurement signal generation circuit 57 in place of the drive/measurement signal generation circuit 17. Among the components of the present embodiment, the same components as those in the first embodiment are provided with the same reference numbers and their descriptions are omitted.

The correction unit 56 performs, on the video signal VS1, a correction different from that performed by the correction unit 16. The current data storing unit 55 is a working memory of the correction unit 56. The current data storing unit 55 includes first to fourth current data storing units 55a to 55d. The first to fourth current data storing units 55a to 55d respectively store current data in accordance with reference values (reference currents) of the currents Im1 to Im4 flowing through the pixel circuit 20 when the first to fourth measurement voltages Vm1 to Vm4 are written to the pixel circuit 20.

As with the first embodiment, the data line drive/current measurement circuit 54 measures the currents Im1 to Im4 flowing through the pixel circuit 20 when the first to fourth measurement voltages Vm1 to Vm4 are written to the pixel circuit 20. In the display device 50, the first to fourth measurement voltages Vm1 to Vm4 are fixedly determined in advance. On the other hand, the reference values of the currents Im1 to Im4 are determined for each pixel circuit 20, and are changed in accordance with characteristics of the elements in the pixel circuit 20. The first to fourth current data storing units 55a to 55d store the first to fourth current data SQI1, SQI2, KRI3, KRI4 with respect to each pixel circuit 20, respectively.

Figure 7:
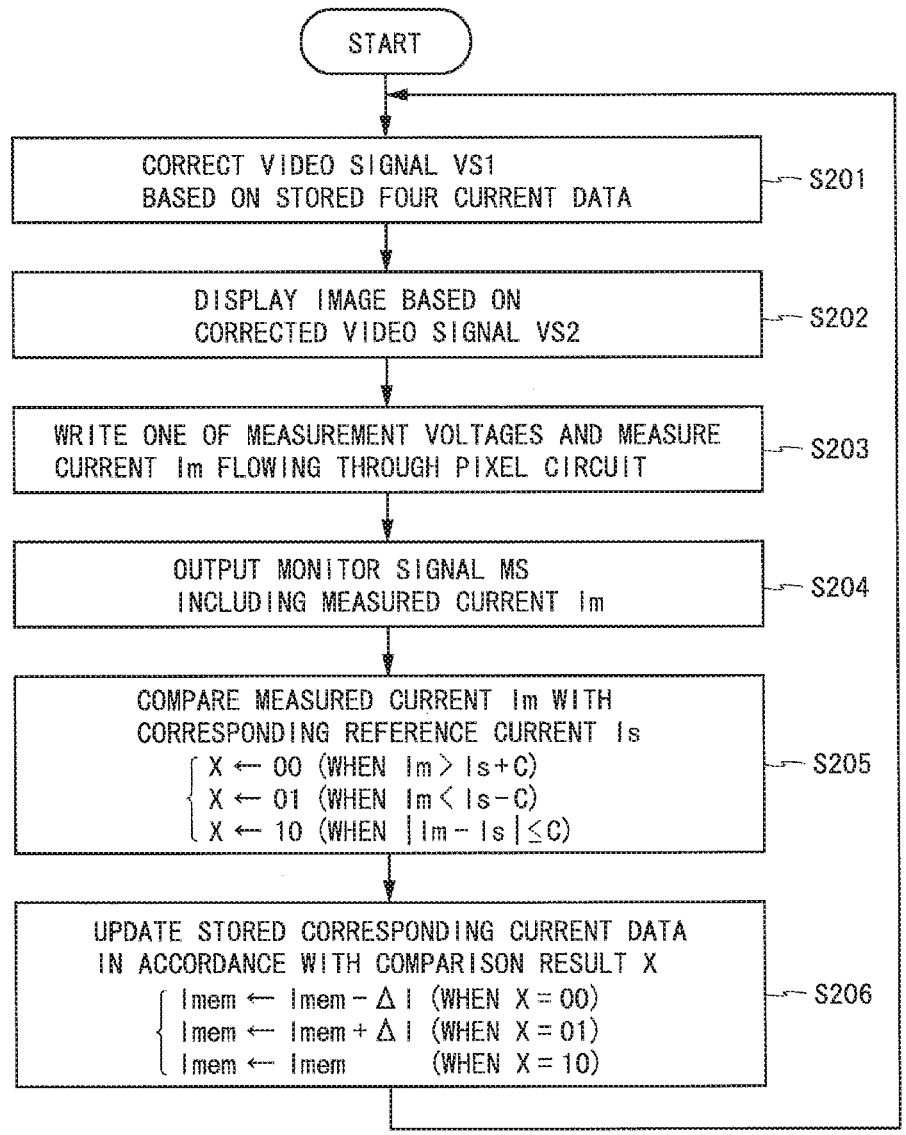
FIG. 7 is a flowchart showing operations of the display device shown in FIG. 6.

FIG. 7 is a flowchart showing operations of the display device 50. The scanning line drive circuit 13, the data line drive/current measurement circuit 54, and the correction unit 56 included in the display device 50 repeatedly perform steps S201 to S206 shown below. Steps S202, S205 are the same as steps S102, S105 shown in FIG. 4, respectively.

The correction unit 56 obtains the corrected video signal VS2 by correcting the video signal VS1 based on the first to fourth current data SQI1, SQI2, KRI3, KRI4 stored in the current data storing unit 55 (step S201). More specifically, in step S201, the correction unit 56 performs a processing shown in FIG. 5 on the code value CV0 included in the video signal VS1. Note that in the present embodiment, the first to fourth current data SQI1, SQI2, KRI3, KRI4 are values stored in the current data storing unit 55 and are not constants. Therefore, since the denominators of the equations (1a), (1b), (2a), and (2b) are not constants, subtractions, multiplications, and divisions are necessary for calculations in steps S111, S112.

Next, the scanning line drive circuit 13 and the data line drive/current measurement circuit 54 display an image based on the corrected video signal VS2 (step S202). Next, the scanning line drive circuit 13 and the data line drive/current measurement circuit 54 write one of the first to fourth measurement voltages Vm1 to Vm4 to the pixel circuits 20 in one row, and measure the current Im flowing through each of the pixel circuits 20 at that time (step S203). The first to fourth measurement voltages Vm1 to Vm4 in step S203 are voltages determined fixedly in advance.

Next, the data line drive/current measurement circuit 54 outputs the monitor signal MS including the measured current Im, to the display control circuit 52 (step S204). Next, the correction unit 56 compares the current Im measured by the data line drive/current measurement circuit 54 with a corresponding reference current Is (step S205). Here, the corresponding reference current Is is one of a square value of the first current data SQI1 for the pixel circuit 20 in the i-th row and the j-th column stored in the first current data storing unit 55a, a square value of the second current data SQI2 for the pixel circuit 20 in the i-th row and the j-th column stored in the second current data storing unit 55b, a K-th power value of the third current data KRI3 for the pixel circuit 20 in the i-th row and the j-th column stored in the third current data storing unit 55c, and a K-th power value of the fourth current data KRI4 for the pixel circuit 20 in the i-th row and the j-th column stored in the fourth current data storing unit 55d. Assuming C as a constant, the correction unit 56 sets the comparison result X to "00" when Im>Is+C is satisfied, sets the comparison result X to "01" when Im<Is-C is satisfied, and sets the comparison result X to "10" when |Im−Is|≤C is satisfied.

Next, the correction unit 56 updates a corresponding current data stored in the current data storing unit 55 in accordance with the comparison result X (step S206). For example, when the first measurement voltage Vm1 is written to the pixel circuit 20 in the i-th row and the j-th column, the first current data SQI1 for the pixel circuit 20 in the i-th row and the j-th column stored in the first current data storing unit 55a is updated in the following manner. When the comparison result X is "00", a predetermined value ΔI is subtracted from the first current data SQI1. When the comparison result X is "01", the predetermined value ΔI is added to the first current data SQI1. When the comparison result X is "10", the first current data SQI1 is not updated. When the second to fourth measurement voltages Vm2 to Vm4 are written to the pixel circuit 20 in the i-th row and the j-th column, the second to fourth current data SQI2, KRI3, KRI4 for the pixel circuit 20 in the i-th row and the j-th column stored in the second to fourth current data storing units 55b to 55d are updated by a similar method.

As described above, the display device 50 according to the present embodiment includes a storing unit (current data storing unit 55) for storing the plurality of the current data in accordance with the reference current with respect to the electro-optical element and the drive transistor for each pixel circuit 20, and the correction unit 56 corrects the video signal VS1 based on the current data SQI1, SQI2, KRI3, KRI4 stored in the storing unit. Therefore, it is possible to obtain the characteristics (threshold voltage and gain) of the electro-optical element and the drive transistor for each pixel circuit 20 based on the stored current data SQI1, SQI2, KRI3, KRI4 and correct the video signal VS1 using the obtained characteristics. Furthermore, the correction unit 56 updates the current data SQI1, SQI2, KRI3, KRI4 stored in the storing unit in accordance with the result obtained by comparing the current Im measured by the current measurement circuit with the reference current Is. With this, the current data SQI1, SQI2, KRI3, KRI4 can be obtained easily.

(Third Embodiment)

In the display devices according to the first and second embodiments, the current source 33 is provided for each output/measurement circuit 30 (in other words, corresponding to the capacitor 32). In third and fourth embodiments, there will be described display devices in which the current source 33 is provided for a plurality of the output/measurement circuits 30 (in other words, corresponding to a plurality of the capacitors 32). In the following, the display device in which the current source 33 is provided corresponding to two capacitors 32 will be described.

Figure 8:
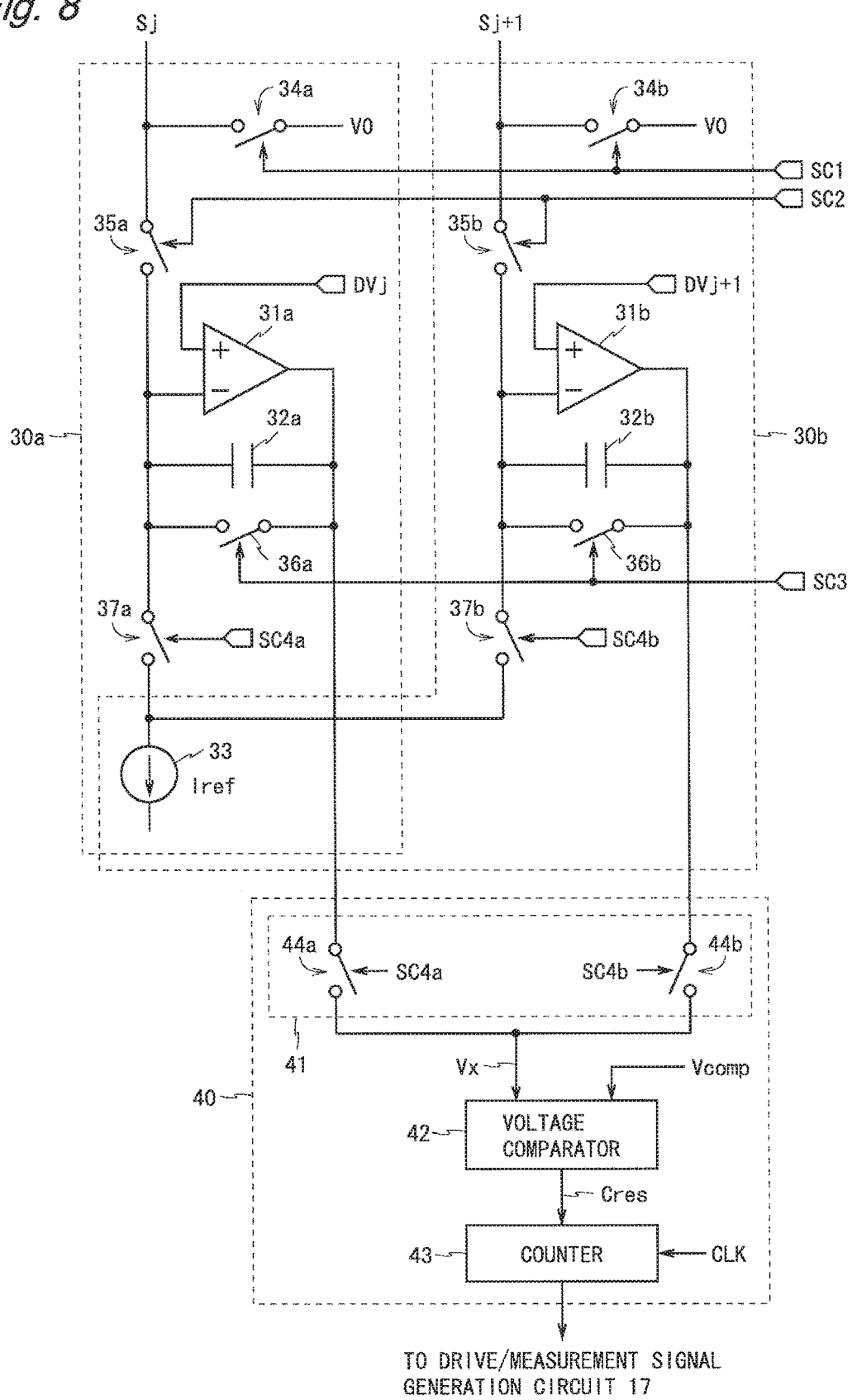
FIG. 8 is a diagram showing a current measurement circuit of a display device according to a third embodiment of the present invention.

The display device according to the third embodiment of the present invention has a same configuration (FIG. 1) as that of the first embodiment. FIG. 8 is a diagram showing a current measurement circuit of the display device according to the present embodiment. FIG. 8 depicts an output/measurement circuit 30a corresponding to the data line Sj, an output/measurement circuit 30b corresponding to a data line Sj+1, and a part of the signal conversion circuit 40 corresponding to the data lines Sj, Sj+1. In the following, "a" is attached to a tail of a reference number of a component related to the data line Sj, and "b" is attached to a tail of a reference number of a component related to the data line Sj+1. The output/measurement circuits 30a, 30b have configurations similar to that of the output/measurement circuit (FIG. 2) according to the first embodiment. However, the output/measurement circuits 30a, 30b share one current source 33. The same current source 33 is connected to other ends (lower ends in FIG. 8) of switches 37a, 37b. The switch 37a turns on when the switch control signal SC4a is at the high level, and the switch 37b turns on when the switch control signal SC4b is at the high level.

The signal conversion circuit 40 includes (m/2) selectors 41, (m/2) voltage comparators 42, and (m/2) counters 43. The selector 41 includes two switches 44a, 44b. One end (upper end in FIG. 8) of the switch 44a is connected to a second terminal of a capacitor 32a, and one end of the switch 44b is connected to a second terminal of a capacitor 32b. The other ends of the switches 44a, 44b are connected to one input terminal of the voltage comparator 42. The switch 44a turns on when the switch control signal SC4a is at the high level, and the switch 44b turns on when the switch control signal SC4b is at the high level.

Figure 9:
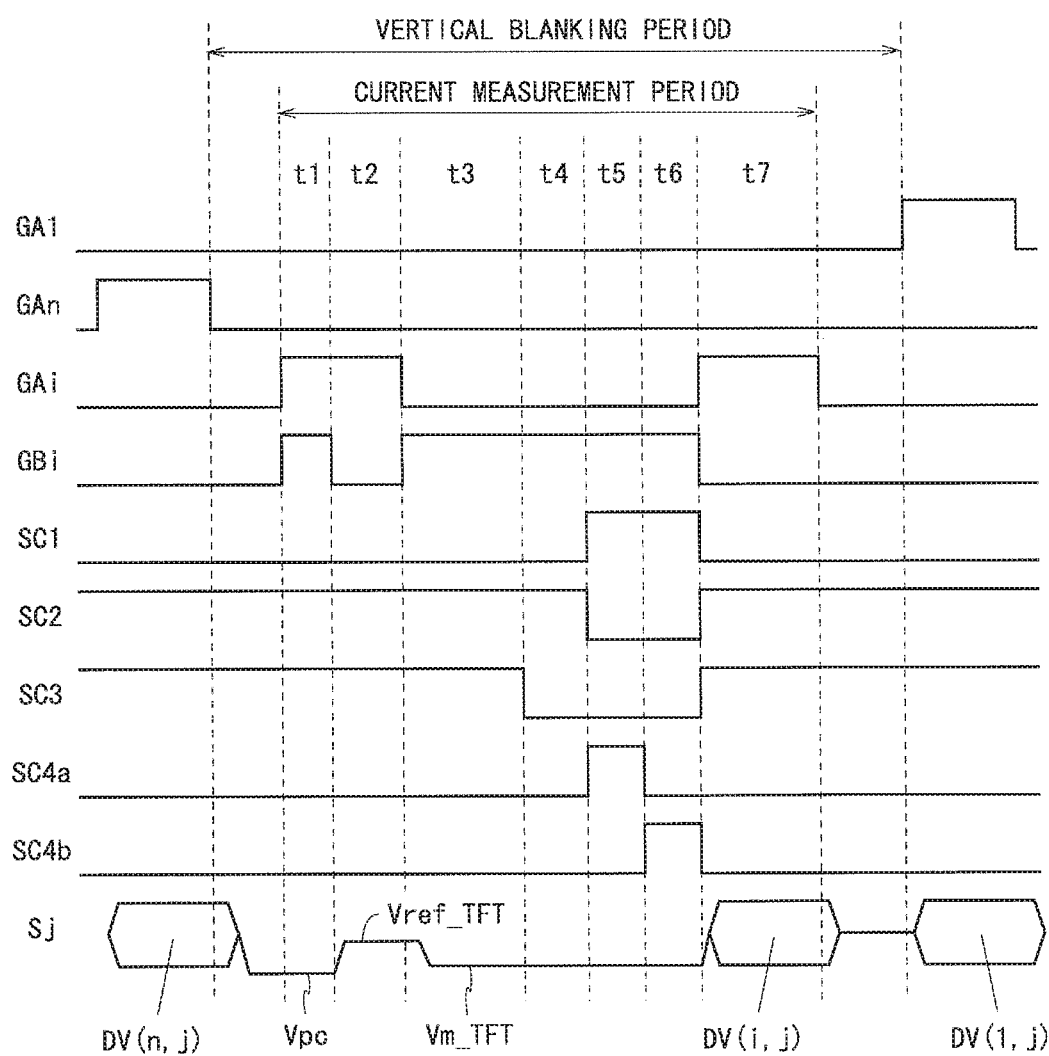
FIG. 9 is a timing chart of the display device according to the third embodiment of the present invention when detecting characteristics of a drive transistor.

FIG. 9 is a timing chart when detecting characteristics of the drive transistor. The timing chart shown in FIG. 9 is different from the timing chart shown in FIG. 3 in the following points. In the period t5, the switch control signal SC4a becomes the high level and the switch control signal SC4b becomes the low level. At this time, the switches 37a, 44a turn on and the switches 37b, 44b turn off. Thus, the first terminal of the capacitor 32a is electrically connected to the one end of the current source 33, and the second terminal of the capacitor 32a is connected to one input terminal of the voltage comparator 42. Therefore, as with the first embodiment, in the period t5, it is possible to measure the current flowing through the pixel circuit 20 in the i-th row and the j-th column in the period t4.

In the period t6, the switch control signal SC4a becomes the low level and the switch control signal SC4b becomes the high level. At this time, the switches 37a, 44a turn off and the switches 37b, 44b turn on. Thus, the first terminal of the capacitor 32b is electrically connected to the one end of the current source 33, and the second terminal of the capacitor 32b is connected to the one input terminal of the voltage comparator 42. Therefore, in the period t6, it is possible to measure the current flowing through the pixel circuit 20 in the i-th row and a (j+1)-th column in the period t4.

In the period t5, although charge accumulated in the capacitor 32a is discharged, an amount of charge accumulated in the capacitor 32b does not change. Therefore, by turning on the switches 37b, 44b after turning on the switches 37a, 44a, it is possible to measure the current flowing through the pixel circuit 20 in the i-th row and the (j+1)-th column after measuring the current flowing through the pixel circuit 20 in the i-th row and the j-th column. Furthermore, a number of the current sources 33 can be reduced by sharing the current source 33 between the output/measurement circuits 30a, 30b.

As described above, in the display device according to the present embodiment, the current source 33 is provided corresponding to a plurality (two) of the capacitors 32.

Therefore, the number of the current sources 33 can be reduced.

(Fourth Embodiment)

Figure 10:
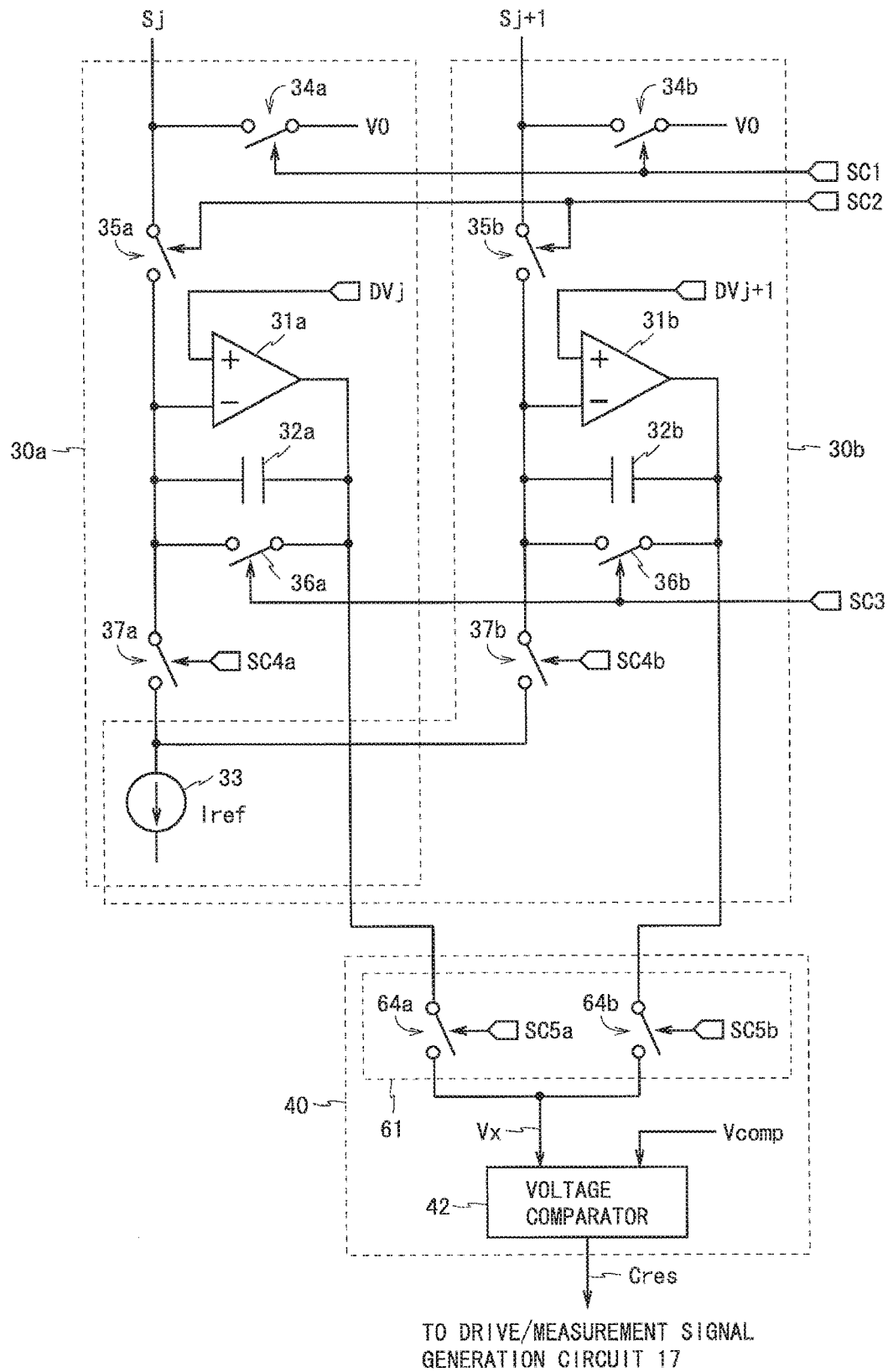
FIG. 10 is a diagram showing a current measurement circuit of a display device according to a fourth embodiment of the present invention.

A display device according to a fourth embodiment of the present invention has a same configuration (FIG. 1) as that of the first embodiment. FIG. 10 is a diagram showing a current measurement circuit of the display device according to the present embodiment. FIG. 10 depicts the output/measurement circuit 30a corresponding to the data line Sj, the output/measurement circuit 30b corresponding to the data line Sj+1, and a part of the signal conversion circuit 40 corresponding to the data lines Sj, Sj+1. The output/measurement circuits 30a, 30b are the same circuits as those in the third embodiment.

The signal conversion circuit 40 includes (m/2) selectors 61 and (m/2) voltage comparators 42. The selector 61 includes two switches 64a, 64b. One end (upper end in FIG. 10) of the switch 64a is connected to the second terminal of the capacitor 32a, and one end of the switch 64b is connected to the second terminal of the capacitor 32b. The other ends of the switches 64a, 64b are connected to the one input terminal of the voltage comparator 42. The switch 64a turns on when the switch control signal SC5a is at the high level, and the switch 64b turns on when the switch control signal SC5b is at the high level.

Figure 11:
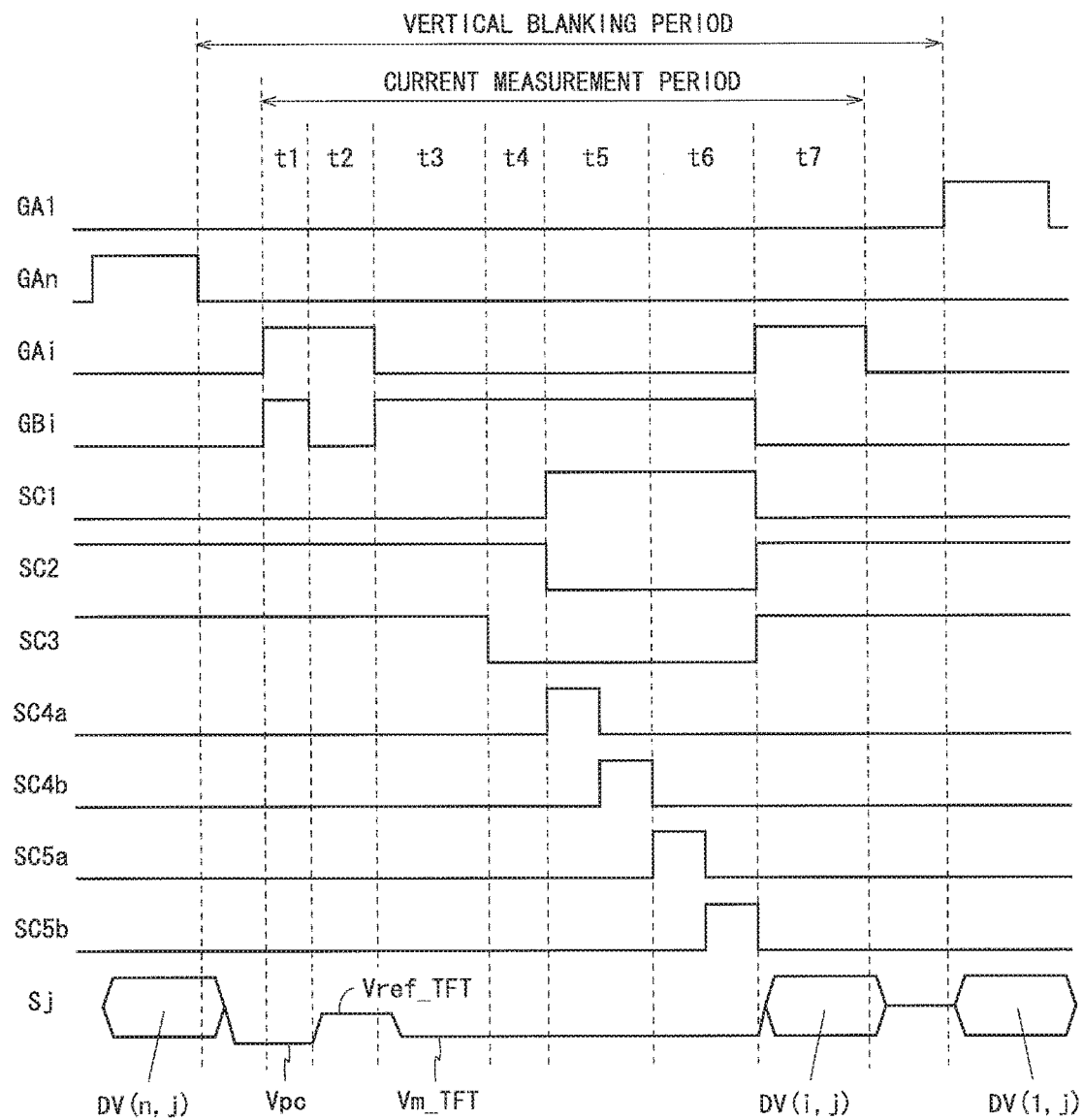
FIG. 11 is a timing chart of the display device according to the fourth embodiment of the present invention when detecting characteristics of a drive transistor.

FIG. 11 is a timing chart when detecting characteristics of the drive transistor. The timing chart shown in FIG. 11 is different from the timing chart shown in FIG. 3 in the following points. In the current measurement period shown in FIG. 11, the period t5 is a discharge period and the period t6 is a measurement period.

In a first half of the period t5, the switch control signal SC4a becomes the high level and the switch control signals SC4b, SC5a, SC5b become the low level. At this time, the switch 37a turns on and the switches 37b, 64a, 64b turn off. Thus, the first terminal of the capacitor 32a is electrically connected to the one end of the current source 33. Therefore, in the first half of the period t5, charge accumulated in the capacitor 32a decreases at a constant speed, and voltages of the first and second terminals of the capacitor 32a decreases by a predetermined amount.

In a second half of the period t5, the switch control signal SC4b becomes the high level and the switch control signals SC4a, SC5a, SC5b become the low level. At this time, the switch 37b turns on and the switches 37a, 64a, 64b turn off. Thus, the first terminal of the capacitor 32b is electrically connected to the one end of the current source 33. Therefore, in the second half of the period t5, charge accumulated in the capacitor 32*b* decreases at a constant speed, and voltages of the first and second terminals of the capacitor 32*b* decreases by a predetermined amount.

In a first half of the period t6, the switch control signal SC5*a* becomes the high level and the switch control signals SC4*a*, SC4*b*, SC5*b* become the low level. At this time, the switch 64*a* turns on and the switches 37*a*, 37*b*, 64*b* turn off. Thus, the second terminal of the capacitor 32*a* is connected to the one input terminal of the voltage comparator 42. The voltage comparator 42 compares a voltage of the second terminal of the capacitor 32*a* with the comparison target voltage Vcomp, and outputs a binary signal Cres indicating a comparison result. The signal Cres output in the first half of the period t6 indicates whether the current flowing through the pixel circuit 20 in the i-th row and the j-th column in the period t4 is larger than a predetermined amount (amount corresponding to the comparison target voltage Vcomp).

In a second half of the period t6, the switch control signal SC5*b* becomes the high level and the switch control signals SC4*a*, SC4*b*, SC5*a* become the low level. At this time, the switch 64*b* turns on, and the switches 37*a*, 37*b*, 64*a* turn off. Thus, the second terminal of the capacitor 32*b* is connected to the one input terminal of the voltage comparator 42. The voltage comparator 42 compares the voltage of the second terminal of the capacitor 32*b* with the comparison target voltage Vcomp, and outputs the binary signal Cres indicating the comparison result. The signal Cres output in the second half of the period t6 indicates whether the current flowing through the pixel circuit 20 in the i-th row and the (j+1)-th column in the period t4 is larger than the predetermined amount.

In the display device according to the present embodiment, the data line drive/current measurement circuit 14 performs steps S103, S104 shown in FIG. 4 using the current measurement circuit shown in FIG. 11. More specifically, the data line drive/current measurement circuit 14 performs steps S103, S104 by appropriately setting the comparison target voltage Vcomp to a level corresponding to (Is+C) or (Is-C) (where Is is the reference current and C is the constant), and comparing one of the voltages of the second terminals of the capacitors 32*a*, 32*b* with the comparison target voltage Vcomp using the voltage comparator 42.

In the first half of the period t5, an amount of the charge accumulated in the capacitor 32*b* does not change. In the second half of the period t5, an amount of the charge accumulated in the capacitor 32*a* does not change. Therefore, by turning on the switches 37*a*, 37*b*, 64*a*, 64*b* sequentially, it is possible to obtain a result indicating whether the current flowing through the pixel circuit 20 in the i-th row and the j-th column is larger than the predetermined amount, and then obtain a result indicating whether the current flowing through the pixel circuit 20 in the i-th row and the (j+1)-th column is larger than the predetermined amount. Furthermore, as with the third embodiment, a number of the current sources 33 can be reduced by sharing the current source 33 between the output/measurement circuits 30*a*, 30*b*.

As described above, in the display device according to the present embodiment, as with the third embodiment, the current source 33 is provided corresponding to a plurality (two) of the capacitors 32. Therefore, the number of the current sources 33 can be reduced. In the third and fourth embodiments, the display devices in which the current source 33 is provided corresponding to two capacitors 32 are described. By a similar method, it is possible to configure a display device in which the current source 33 is provided corresponding to three or more capacitors 32.

As for the display devices according to the embodiments of the present invention, following variants can be configured. As described above, according to the display device according to each embodiment, it is possible to measure the current flowing through the pixel circuit 20 based on the terminal voltage of the capacitor 32 without being affected by the capacitance of the capacitor 32. However, the measured current is affected by parasitic capacitance of wirings and the like. Thus, a display device according to a variant measures the current in a state where no charge is accumulated in the capacitor 32 (hereinafter, this processing is referred to as dummy measurement), and obtains a difference between a result of a normal measurement and a result of the dummy measurement. With this, it is possible to measure the current flowing through the pixel circuit 20 more accurately without being affected by the parasitic capacitance of wiring and the like.

Figure 12:
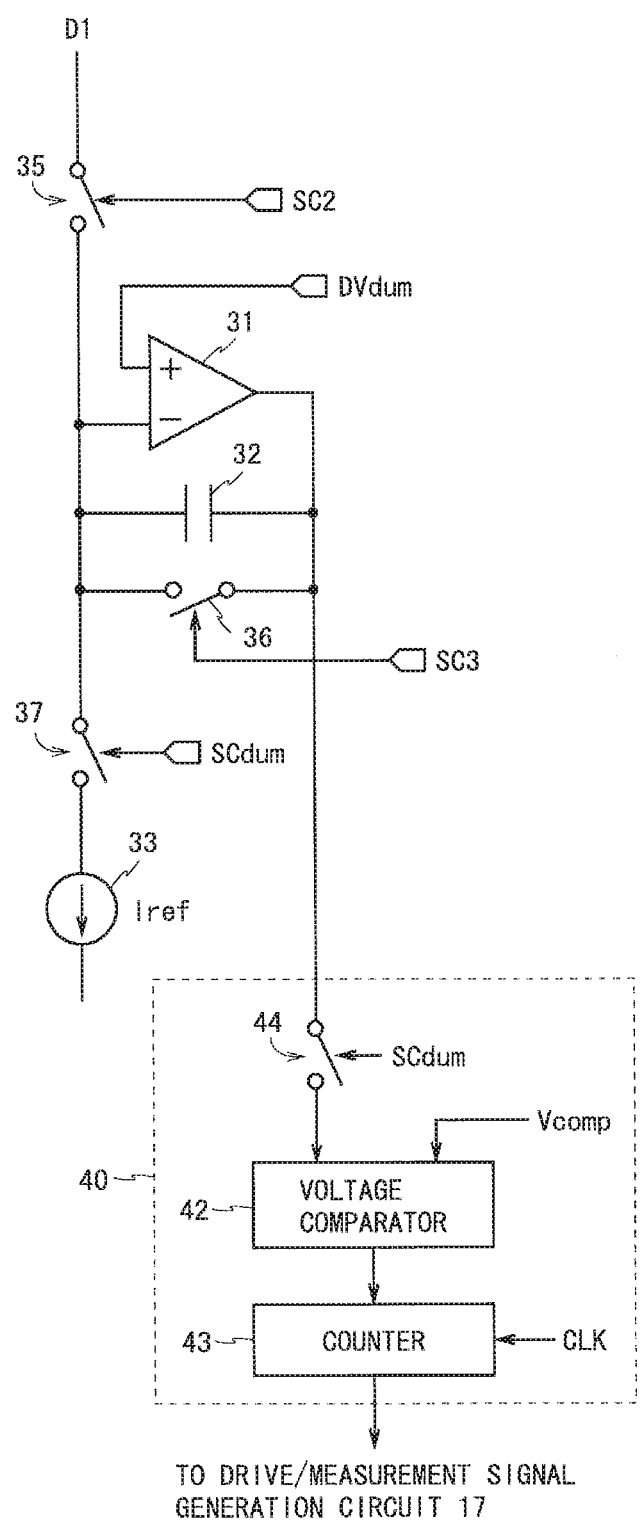
FIG. 12 is a diagram showing a dummy measurement circuit of a display device according to a variant of the present invention.

The display device according to the variant may include a dummy measurement circuit shown in FIG. 12 in order to perform the dummy measurement. The dummy measurement circuit shown in FIG. 12 has a same configuration as that of the current measurement circuit shown in FIG. 8. A dummy signal DVdum having a voltage of 0V is supplied to the non-inverting input terminal of the operational amplifier 31. The switches 37, 44 turn on when the switch control signal SCdum is at the high level. The switch control signal SCdum becomes the high level at a timing when performing the dummy measurement.

In the current measurement circuit (FIG. 2) according to the first embodiment, when the capacitance of the capacitor 32 is C1 and the input capacitance of the capacitor 32 is Cin, a noise gain is (Cin/C1). Thus, if the display unit 11 is a large-size display panel, an S/N ratio degrades. Thus, the display device according to the variant performs the normal measurement using the current measurement circuit and the dummy measurement using the dummy measurement circuit at a same timing, and obtains a difference between a result of the normal measurement and a result of the dummy measurement. With this, it is possible to reduce effects of the noise in addition to effects of the variation of the capacitance of the capacitor 32.

Furthermore, although the display devices according to the first to fourth embodiments include the pixel circuit 20, the display device may include other pixel circuits. Furthermore, although the display device 10 according to the first embodiment includes the measurement voltage storing unit 15 and the display device 50 according to the second embodiment includes the current data storing unit 55, the display device may include a storing unit for storing, for the pixel circuit, the threshold voltage and the gain of the drive transistor and the threshold voltage and the gain of the organic EL element. In this case, the correction unit obtains the threshold voltage and the gain to be stored in the storing unit based on the measurement voltage and a measured current, and corrects the video signal based on the threshold voltage and the gain stored in the storing unit.

As described above, according to the display device according to the present invention, in the current measurement circuit, by the action of the first to third switches, the capacitor is charged with the charge of the current flowing through the pixel circuit, and then a constant current flows through the current source. Therefore, it is possible to measure the current flowing through the pixel circuit based on the terminal voltage of the capacitor without being affected by the capacitance of the capacitor, compensate for the capacitance variation of the capacitor in the current measurement circuit, and perform high image quality display.

INDUSTRIAL APPLICABILITY

Since the display device of the present invention has a feature that it can compensate for the capacitance variation of the capacitor in the current measurement circuit and can perform high image quality display, it can be used for various kinds of display devices having the pixel circuit including the electro-optical element, such as an organic EL display device.

DESCRIPTION OF REFERENCE CHARACTERS 10, 50: DISPLAY DEVICE
11: DISPLAY UNIT
12, 52: DISPLAY CONTROL CIRCUIT
13: SCANNING LINE DRIVE CIRCUIT
14, 54: DATA LINE DRIVE/CURRENT MEASUREMENT CIRCUIT
15: MEASUREMENT VOLTAGE STORING UNIT
16, 56: CORRECTION UNIT
17, 57: DRIVE/MEASUREMENT SIGNAL GENERATION CIRCUIT
20: PIXEL CIRCUIT
21: TRANSISTOR (DRIVE TRANSISTOR)
22: TRANSISTOR (WRITE CONTROL TRANSISTOR)
23: TRANSISTOR (READ CONTROL TRANSISTOR)
24: ORGANIC EL ELEMENT (ELECTRO-OPTICAL ELEMENT)
25, 32: CAPACITOR
30: OUTPUT/MEASUREMENT CIRCUIT
31: OPERATIONAL AMPLIFIER
33: CURRENT SOURCE
34, 44, 64: SWITCH
35: SWITCH (THIRD SWITCH)
36: SWITCH (FIRST SWITCH)
37: SWITCH (SECOND SWITCH)
40: SIGNAL CONVERSION CIRCUIT
41, 61: SELECTOR
42: VOLTAGE COMPARATOR
43: COUNTER
55: CURRENT DATA STORING UNIT
GA1 to GAn, GB1 to GBn: SCANNING LINE
S1 to Sm: DATA LINE

The invention claimed is:

1. An active-matrix type display device comprising:
a display unit including a plurality of scanning lines, a plurality of data lines, and a plurality of pixel circuits arranged two-dimensionally;
a scanning line drive circuit configured to drive the scanning lines;
a data line drive circuit configured to drive the data lines;
a current measurement circuit configured to measure a current flowing through each pixel circuit of the plurality of pixel circuits; and
a correction unit configured to correct a video signal to be supplied to the data line drive circuit, based on the current measured by the current measurement circuit, wherein
the current measurement circuit includes:
a capacitor configured to be charged with charge of the current flowing through a respective pixel circuit of the plurality of pixel circuits;
a discharge circuit configured to discharge the charge accumulated in the capacitor at a constant speed;
an operational amplifier including an inverting input terminal connected to a first terminal of the capacitor and an output terminal connected to a second terminal of the capacitor;
a first switch provided between the first terminal and the second terminal of the capacitor;
a second switch having one end connected to the first terminal of the capacitor;
a voltage comparator to compare the voltage of the second terminal of the capacitor with a comparison target voltage; and
a counter to switch whether to update a count value in accordance with a comparison result by the voltage comparator,
the discharge circuit is a current source connected to another end of the second switch,
the discharge circuit is provided to be electrically connectable to a first terminal of the capacitor, and
the current measurement circuit measures the current flowing through each pixel circuit by measuring time until a voltage of a second terminal of the capacitor reaches a comparison target voltage.

2. The display device according to claim 1, wherein the current measurement circuit further includes a third switch having one end connected to the data line and the other end connected to the first terminal of the capacitor.

3. The display device according to claim 1, wherein the current measurement circuit further includes a selector configured to select one voltage from among voltages of second terminals of a plurality of the capacitors and output a selected voltage to the voltage comparator.

4. The display device according to claim 1, wherein the current source is provided corresponding to a plurality of the capacitors.

5. The display device according to claim 1, wherein a current flowing through the current source is larger than a maximum current flowing through the respective pixel circuit.

6. The display device according to claim 1, wherein each pixel circuit of the plurality of pixel circuits includes an electro-optical element, and a drive transistor connected in series with the electro-optical element.

7. The display device according to claim 6, further comprising a storing unit configured to store a plurality of measurement voltages with respect to the electro-optical element and the drive transistor for each pixel circuit, wherein
the correction unit is configured to correct the video signal based on the measurement voltage stored in the storing unit.

8. The display device according to claim 7, wherein the correction unit is configured to update the measurement voltage stored in the storing unit, in accordance with a result obtained by comparing the current measured by the current measurement circuit with a reference current.

9. The display device according to claim 6, further comprising a storing unit configured to store a plurality of current data in accordance with a reference current with respect to the electro-optical element and the drive transistor for each pixel circuit, wherein
the correction unit is configured to correct the video signal based on the current data stored in the storing unit.

10. The display device according to claim 9, wherein the correction unit is configured to update the current data stored in the storing unit, in accordance with a result obtained by comparing the current measured by the current measurement circuit with the reference current.

11. The display device according to claim 2, wherein a current measurement period of each pixel circuit of the plurality of pixel circuits sequentially includes a first period in which a measurement voltage is applied to a non-inverting input terminal of the operational amplifier, the first and third switches are in a conduction state, and the second switch is in a non-conduction state, a second period in which the first switch is in the non-conduction state, and a third period in which the second switch is in the conduction state and the third switch is in the non-conduction state.

12. The display device according to claim 11, wherein the current measurement period of each pixel circuit of the plurality of pixel circuits further includes, after the third period, a period in which a data voltage based on the video signal is applied to the non-inverting input terminal of the operational amplifier, the first and third switches are in the conduction state, and the second switch is in the non-conduction state.

13. The display device according to claim 12, wherein the current measurement period of each pixel circuit of the plurality of pixel circuits further includes, before the first period, a period in which a precharge voltage is applied to the non-inverting input terminal of the operational amplifier, the first and third switches are in the conduction state, and the second switch is in the non-conduction state.

14. The display device according to claim 6, wherein each pixel circuit of the plurality of pixel circuits further includes:
- a write control transistor having a first conduction terminal connected to the data line, a second conduction terminal connected to a control terminal of the drive transistor, and a control terminal connected to a first scanning line in the scanning lines; and
- a read control transistor having a first conduction terminal connected to the data line, a second conduction terminal connected to a connection point of the drive transistor and the electro-optical element, and a control terminal connected to a second scanning line in the scanning lines.

* * * * *